United States Patent
Chen et al.

(10) Patent No.: US 12,446,321 B2
(45) Date of Patent: Oct. 14, 2025

(54) CIRCUITS DESIGNED AND MANUFACTURED WITH FIRST AND SECOND FIN BOUNDARIES

(71) Applicant: Taiwan Semiconductor Manufacturing Company, Ltd., Hsinchu (TW)

(72) Inventors: Chung-Hui Chen, Hsinchu (TW); Weichih Chen, Hsinchu (TW); Tien-Chien Huang, Hsinchu (TW); Chien-Chun Tsai, Jhudong Township (TW); Ruey-Bin Sheen, Taichung (TW); Tsung-Hsin Yu, Hsinchu (TW); Chih-Hsien Chang, New Taipei (TW); Cheng-Hsiang Hsieh, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 816 days.

(21) Appl. No.: 17/543,255

(22) Filed: Dec. 6, 2021

(65) Prior Publication Data

US 2022/0278091 A1    Sep. 1, 2022

Related U.S. Application Data

(60) Provisional application No. 63/166,116, filed on Mar. 25, 2021, provisional application No. 63/154,270, filed on Feb. 26, 2021.

(51) Int. Cl.
*H10D 89/10* (2025.01)
*H10D 30/62* (2025.01)
(Continued)

(52) U.S. Cl.
CPC .......... *H10D 89/10* (2025.01); *H10D 30/6219* (2025.01); *H10D 64/01* (2025.01); *H10D 84/0158* (2025.01); *H10D 84/038* (2025.01); *H10D 84/834* (2025.01); *H03K 17/6871* (2013.01)

(58) Field of Classification Search
CPC .......... H01L 29/401; H01L 21/823431; H01L 27/0886; H01L 29/41791; H01L 27/0207
See application file for complete search history.

(56) References Cited

U.S. PATENT DOCUMENTS 8,530,286 B2    9/2013  Shifren et al.
8,701,055 B1    4/2014  Lee et al.
(Continued)

FOREIGN PATENT DOCUMENTS

TW    201145451 A    12/2011
TW    202002039 A    1/2020

*Primary Examiner* — Chad M Dicke
*Assistant Examiner* — Valerie N Newton
(74) *Attorney, Agent, or Firm* — Merchant & Gould P.C

(57) ABSTRACT

A semiconductor structure including first finfet cells and second finfet cells. Each of the first finfet cells has an analog fin boundary according to analog circuit design rules, and each of the second finfet cells has a digital fin boundary according to digital circuit design rules. The semiconductor structure further includes first circuits formed with the first finfet cells, second circuits formed with the second finfet cells, and third circuits formed with one or more of the first finfet cells and one or more of the second finfet cells.

20 Claims, 16 Drawing Sheets

(51) Int. Cl.
*H10D 64/01* (2025.01)
*H10D 84/01* (2025.01)
*H10D 84/03* (2025.01)
*H10D 84/83* (2025.01)
H03K 17/687 (2006.01)

(56) References Cited

U.S. PATENT DOCUMENTS

| | | | |
|---|---|---|---|
| 10,665,673 B2 | 5/2020 | Lin et al. | |
| 2012/0280331 A1* | 11/2012 | Ou | G06F 30/39 |
| | | | 438/584 |
| 2013/0200449 A1* | 8/2013 | Chen | H01L 27/1211 |
| | | | 257/E21.409 |
| 2017/0309626 A1* | 10/2017 | Cheng | H01L 21/823418 |
| 2019/0211475 A1* | 7/2019 | Ito | G06F 30/398 |
| 2020/0381548 A1* | 12/2020 | Lu | H01L 29/6656 |
| 2021/0111246 A1* | 4/2021 | Lie | H01L 21/823871 |

\* cited by examiner

| | Unit | Analog fin boundary | | | | Digital fin boundary large CPP | Digital fin boundary min. CPP |
|---|---|---|---|---|---|---|---|
| 102 Voltage | Volts | 1.1V~1.8V | | | | <1.1V | |
| 104 Cell Height | nm | 0.5X to 5X | | | | | |
| 106 Fin density in Y direction | Fin/Height (nm) | Ref | | | | 95-50% | Ref |
| 108 Lg: channel Length | nm | Ref: Minimal channel length | | | | | |
| 110 CPP | nm | 1.2X~80X | 2X~5X | 1X~2X | Ref | 1.05X~2X | Ref |
| 112 Lg/CPP (X-direction) | | 20-90% | 20-90% | Ref | Ref | 4-25% | 5-30% |
| Layout | | 36 | 34 | 32 | 30 | 38a | 38b |

FIG. 3

| - | Unit | Analog fin boundary | Digital fin boundary |
|---|---|---|---|
| Voltage | Volts | 1.1V~1.8V | <1.1V |
| Cell Height | nm | 0.5X to 5X | Ref |
| Fin density in Y direction | Fin/Height (nm) | | Ref |
| Lg: channel Length | nm | 1.2X~80X | Ref: Minimal channel length |
| CPP | nm | 2X~5X | Ref |
| Lg/CPP (X-direction) | | 41% | Ref |
| Layout | | 41% | |

CIRCUITS DESIGNED AND MANUFACTURED WITH FIRST AND SECOND FIN BOUNDARIES

CROSS-REFERENCE TO RELATED APPLICATIONS

This application claims the benefit of U.S. Provisional Patent Application No. 63/154,270, filed on Feb. 26, 2021, and U.S. Provisional Patent Application No. 63/166,116, filed on Mar. 25, 2021, the disclosures of which are incorporated by reference in their entirety.

BACKGROUND

Electronic circuits continue to be designed and manufactured to operate at higher and higher operating speeds. Circuits such as serializer/deserializer (serdes) circuits currently operate in a frequency range from 28 gigabits-per-second (Gbps) to 448 Gbps. In the past, these circuits have been designed using analog circuit design rules including an analog fin formation or boundary. Key device parameters for operating at these speeds include trans-conductance (GM), unit gain frequency (UGF), and electromigration (EM) currents. To achieve higher operating speeds, all three of these key device parameters have been increased using larger contact polycrystalline silicon (poly) pitch (CPP), wider metal over diffusion [source/drain contacts] (MD), larger vias, wider metal lines, and larger spaces. Changing these structures can reduce both resistance and capacitance and improve the GM, UGF, and maximum EM currents. However, as design and manufacturing processes are scaled down, performance improvements using the analog circuit design rules and the analog fin boundary is limited by device size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 3 is a table illustrating the dimensions of certain characteristics of the finfet cells designed using the analog fin boundary and the finfet cells designed using the digital fin boundary, in accordance with some embodiments.

DETAILED DESCRIPTION

Figure 1:
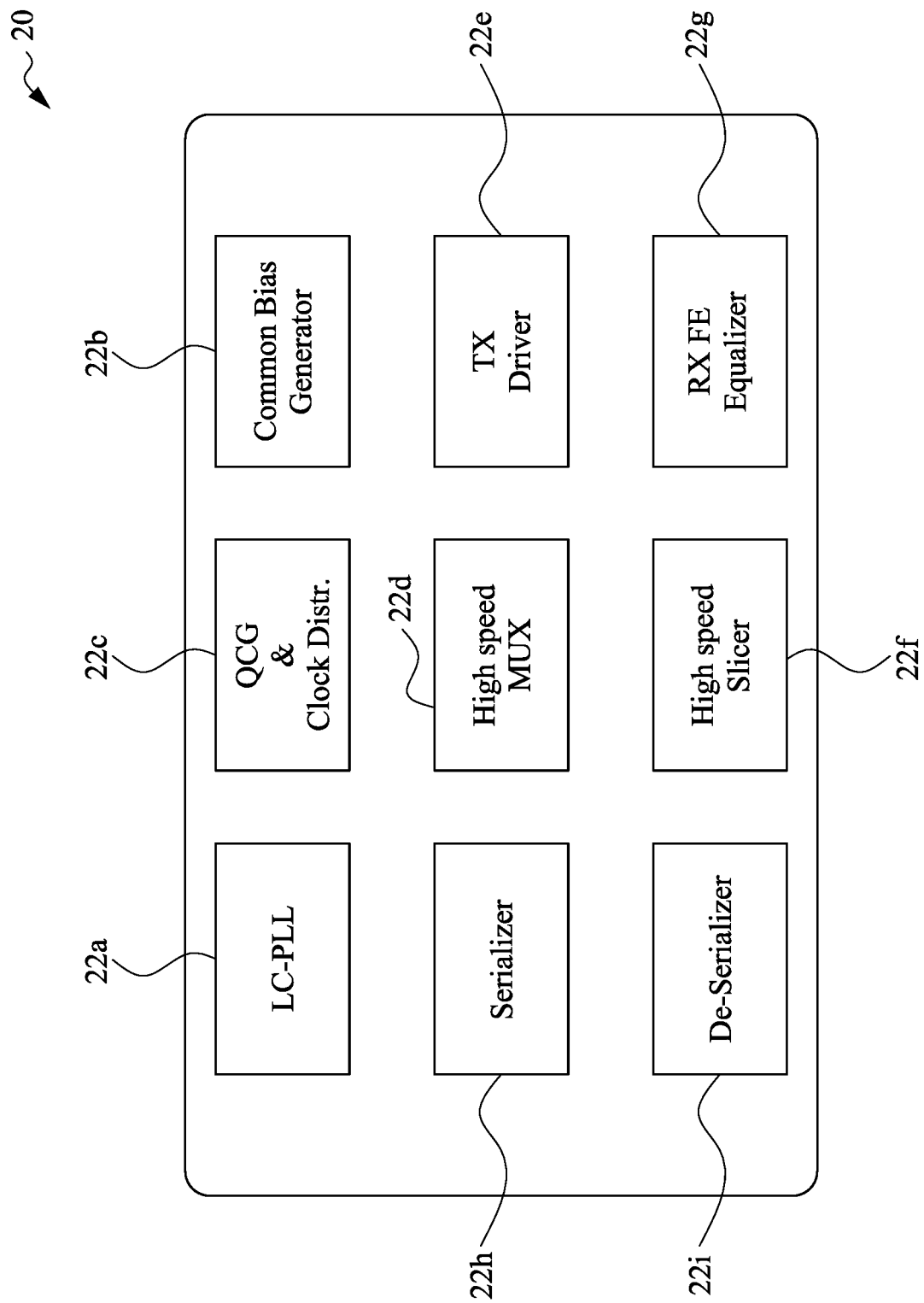
FIG. 1 is a block diagram schematically illustrating an example of a serdes circuit designed and manufactured using both analog circuit design rules with an analog fin boundary and digital circuit design rules with a digital fin boundary, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the past, some semiconductor structures, such as ICs, have been designed and manufactured using only analog circuit design rules and an analog fin boundary. These ICs can include one or more analog circuits, one or more digital circuits, a mixture of analog and digital circuits, and/or a serdes circuit. However, as manufacturing processes are scaled down, performance improvements using the analog fin boundary are limited by device size.

To meet the challenges of increased operating speeds and smaller device sizes, the semiconductor structures of the present disclosure include circuits, such as analog circuits, digital circuits, a mixture of analog and digital circuits, and/or a serdes circuit, that are designed and manufactured using a combination of a first set of design rules with a first fin boundary and a second set of design rules with a second fin boundary. In some embodiments, the first set of design rules are different than the second set of design rules and the first fin boundary is different than the second fin boundary.

In some embodiments, the first set of design rules are analog circuit design rules with an analog fin boundary and the second set of design rules are digital circuit design rules (logic design rules), such as standard cell logic design rules, with a digital fin boundary. The performance of circuits designed and manufactured using the digital circuit design rules improves as process geometries are scaled down or reduced. In some embodiments, the semiconductor structures that are the subject matter of the present disclosure include analog circuits, digital circuits, mixed analog and digital circuits, and/or one or more serdes circuits designed and manufactured using a combination of the analog circuit design rules with the analog fin boundary and the digital circuit design rules with the digital fin boundary.

In some embodiments, each of the first and second sets of design rules includes spacing criteria between each of the vias in the layout design. In some embodiments, each of the first and second sets of design rules includes pitch spacing criteria between via layout patterns. In some embodiments, each of the first and second sets of design rules includes pitch spacing criteria between fin layout patterns of layout designs. In some embodiments, each of the first and second sets of design rules includes spacing criteria between via layout patterns and cut feature layout patterns. In some embodiments, each of the first and second sets of design rules includes spacing criteria between active region layout patterns and cut feature layout patterns. In some embodiments, each of the first and second sets of design rules includes spacing criteria between active region layout patterns. In some embodiments, each of the first and second sets of design rules includes one or more MD design rules. In some embodiments, each of the first and second sets of design rules includes one or more via over gate [gate contact] (VG) design rules. In some embodiments, each of the first and second sets of design rules includes one or more metal zero (M0) track design rules.

Throughout this disclosure, some finfet cells and circuits that were conventionally designed and manufactured using the analog circuit design rules and the analog fin boundary are designed and manufactured using the digital circuit design rules and the digital fin boundary. These analog finfet cells and circuits are sometimes referred to herein as analog cells designed using the digital circuit design rules and the digital fin boundary. In some embodiments, these analog cells can be used in analog circuits, digital circuits, a mixture of analog and digital circuits, and/or in serdes circuits.

The analog finfet cells that are designed and manufactured with the digital fin boundary include fins that are not situated on grid lines of a fin grid structure associated with the analog fin boundary. Instead, the fins are situated between or interleaved with the grid lines of the fin grid structure. With the fins situated between the grid lines of the fin grid structure, the height of the finfet cells can be decreased and the size of the device reduced. Also, the digital fin boundary of the fins in these finfet cells is the same as the digital fin boundary of fins in logic cells, such that these finfet cells can be placed directly adjacent the logic cells, without including a keep-out zone or region between the finfet cells and the logic cells. Not including a keep-out zone saves space and reduces the size of the device. In addition, the digital fin boundary leaves a space between fins in the middle of the finfet cell, which can be used for routing. In some embodiments, using the space between fins for routing increases space usage and reduces the size of the device.

In some embodiments, the analog finfet cells that are designed with the digital fin boundary provide higher GM, higher UGF, and higher maximum EM currents, such that these finfet cells are used as switching transistors in current mode logic.

In some embodiments, circuits including analog cells designed and manufactured using the digital circuit design rules and the digital fin boundary include MEOL layers that are not included in circuits designed and manufactured using the analog circuit design rules and the analog fin boundary. For example, circuits designed and manufactured using the digital fin boundary can include a larger via over diffusion [source/drain contact] (VD2) to the MD to improve performance, since the resistance of VD2 is at least 50% lower than the resistance of a smaller via over diffusion [source/drain contact] (VD) to the MD. Also, these circuits can include cut PODE that is filled with a high-K dielectric that reduces leakage and increases isolation. Together, these features increase the on current (Ion) and the GM and decrease the current times resistance (IR) voltage drop.

Also, finfet cells of the disclosure designed with the analog fin boundary can be long channel finfets and used in input/output (I/O) circuits. Benefits of a long channel finfet include: the noise of a long channel finfet is lower; the long channel finfet can bear higher voltages since the oxide dielectric may be thicker; and the fin density of the long channel finfet is higher. Where, to scale down area, decoupling capacitors use higher fin density, and where the length of the channel (Lg) of a long channel finfet divided by the CPP is higher, the capacitor density is higher.

In some embodiments, the circuits including the finfet cells designed and manufactured using the digital circuit design rules and the digital fin boundary include shorter MD such that the maximum EM current is higher, shorter M0 lines such that the maximum EM current is higher, and shorter second layer metal (M1) lines such that the maximum EM current is higher.

In some embodiments, compared with circuits designed using larger CPP, circuits including the finfet cells designed and manufactured using the digital circuit design rules and the digital fin boundary have higher GM, higher UGF, and higher maximum EM currents. The GM is higher since resistance is lower in the MEOL and the BEOL. The UGF is higher, where UGF=GM/C, since the GM is higher, and the MEOL capacitance C is smaller. Also, the maximum EM current is higher with shorter metal line lengths, where the digital circuit design rules allow M0 to be cut and a shorter cell height results in shorter M1 lines.

FIG. 1 is a block diagram schematically illustrating an example of a serdes circuit 20 that is designed and manufactured using both analog circuit design rules with an analog fin boundary and digital circuit design rules with a digital fin boundary, in accordance with some embodiments. This contrasts with serdes circuits from the past that were designed and manufactured using only analog circuit design rules and an analog fin boundary.

The serdes circuit 20 includes multiple circuit elements or blocks 22a-22i. In embodiments, at least one of the circuit blocks 22a-22i is designed and manufactured using only analog circuit design rules and the analog fin boundary, at least one of the circuit blocks 22a-22i is designed and manufactured using only digital circuit design rules and the digital fin boundary, and at least one of the circuit blocks 22a-22i is designed and manufactured using both the analog circuit design rules and the analog fin boundary and the digital circuit design rules and the digital fin boundary.

The circuits designed and manufactured using one or more of the analog circuit design rules with the analog fin boundary and the digital circuit design rules with the digital fin boundary include finfets that have active areas that include source diffusion portions, drain diffusion portions, and gates situated between the source diffusion portions and the drain diffusion portions. In some embodiments, the active area layout patterns are referred to as oxide diffusion (OD) region layout patterns, where the OD region layout patterns are usable to manufacture source and/or drain regions of one or more transistors. In some embodiments, poly is used to contact the gates of the finfets.

In some embodiments, the analog circuit design rules and the analog fin boundary are used to provide long channel finfets that have higher active area or fin densities. The long channel finfets have lower noise levels and the long channel finfets may have a thicker oxide layer, such that the long channel finfets can bear higher voltages and are well suited for use in IO devices.

In some embodiments, the digital circuit design rules and the digital fin boundary are used to design and manufacture finfets that have a higher GM, a higher UGF, and a higher maximum EM current. In some embodiments, these finfets have MEOL layers and BEOL layers that have lower interconnect resistance, which results in a higher GM, and in some embodiments, these finfets have a smaller cell size that results in lower capacitance values C. As a result, UGF=GM/C is higher with the higher GM and the lower capacitance values C. In addition, in some embodiments these finfets have shorter metal tracks, such as shorter M0 tracks and shorter M1 tracks due to the smaller cell size, which increases the maximum EM current.

In some embodiments, circuit blocks 22a and 22b are designed and manufactured using only the analog circuit design rules and the analog fin boundary. The circuit blocks 22a and 22b include a long channel-phase locked loop (LC-PLL) and a common bias generator, respectively. Long channel finfets made with the analog fin boundary are used in the LC-VCO to minimize noise, and long channel finfets are used in current mirrors to reduce the area used in the IC.

In some embodiments, circuit blocks 22c-22g are designed and manufactured according to the digital circuit design rules and the digital fin boundary. The circuit blocks 22c-22g include a quaternary clock generator (QCG) and clock distribution elements, a high-speed multiplexer (MUX), a transmit (TX) driver, a high-speed slicer, and a receiver (RX) front end (FE) equalizer, respectively. The digital fin boundary is used on these circuits to attain the high bandwidth of the serdes circuit 20.

In embodiments, circuit blocks 22h and 22i are designed and manufactured using both the analog fin boundary and the digital fin boundary. The circuit blocks 22h and 22i include a serializer circuit and a deserializer circuit, respectively. In these circuits, from an area point of view, the analog fin boundary has better active area densities than the digital fin boundary, such that if these circuits were designed using only the digital fin boundary, they would suffer an area penalty.

Figure 2:
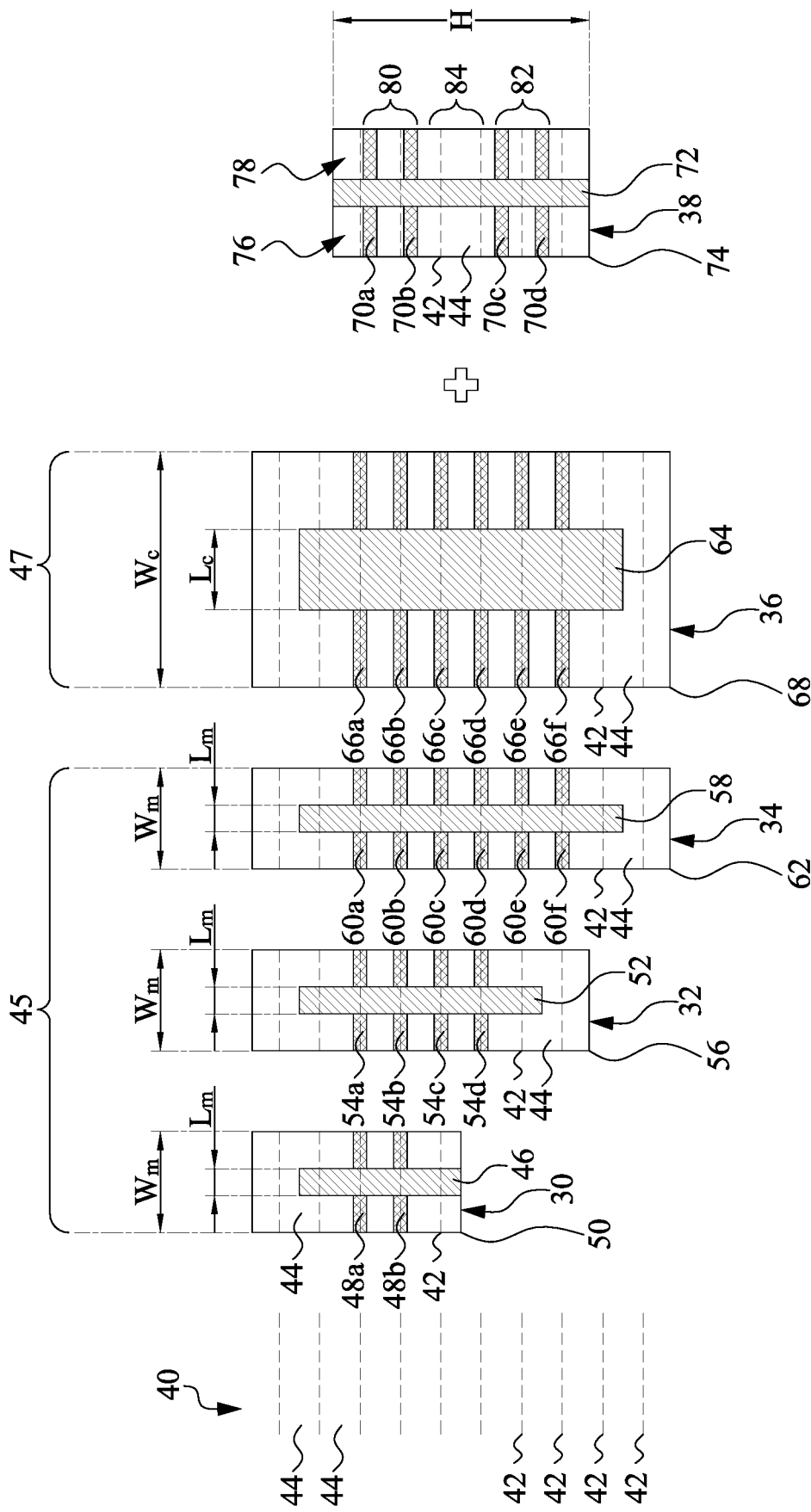
FIG. 2 is a diagram schematically illustrating a fin field-effect transistor (finfet) cell designed using the digital circuit design rules and the digital fin boundary and finfet cells designed using the analog circuit design rules and the analog fin boundary, in accordance with some embodiments.

FIG. 2 is a diagram schematically illustrating finfet cells 30, 32, 34, and 36 designed using the analog circuit design rules and the analog fin boundary and a finfet cell 38 designed using the digital circuit design rules and the digital fin boundary instead of the analog circuit design rules and the analog fin boundary, in accordance with some embodiments.

The example finfet cells 30, 32, 34, and 36 that are designed and manufactured using the analog circuit design rules and the analog fin boundary are laid out on a fin grid structure 40 that corresponds to and is associated with the analog circuit design rules and the analog fin boundary. The fin grid structure 40 includes grid lines 42 that are equally spaced (or separated by an equal distance) and grid spaces 44 between the grid lines 42.

The finfet cells 30, 32, 34, and 36 are organized into two groups. The first group 45 includes finfet cells 30, 32, and 34, which are designed with minimal channel lengths Lm and with minimal CPP or larger CPP. The second group 47 includes a finfet cell 36, which is a long channel finfet including a long channel length Lc.

The finfet cell 30 includes a gate 46, two active areas or fins 48a and 48b, and a cell boundary 50. The two fins 48a and 48b are separated by an equal distance, i.e., the fin pitch, and situated on two equally spaced grid lines 42 of the equal fin grid structure 40. Each of the fins 48a and 48b aligns with one of the grid lines 42. The cell boundary 50 spans about six grid spaces 44.

The finfet cell 32 includes a gate 52, four active areas or fins 54a-54d, and a cell boundary 56. The four fins 54a-54d are separated by an equal distance, i.e., the fin pitch, and situated on four equally spaced grid lines 42 of the equal fin grid structure 40. Each of the fins 54a-54d aligns with one of the grid lines 42. The cell boundary 56 spans about nine grid spaces 44.

The finfet cell 34 includes a gate 58, six active areas or fins 60a-60f, and a cell boundary 62. The six fins 60a-60f are separated by an equal distance, i.e., the fin pitch, and situated on six equally spaced grid lines 42 of the equal fin grid structure 40. Each of the fins 60a-60f aligns with one of the grid lines 42. The cell boundary 62 spans about eleven grid spaces 44.

The finfet cell 36 is the long channel finfet designed using the analog circuit design rules and the analog fin boundary. The finfet cell 36 includes a gate 64, six active areas or fins 66a-66f, and a cell boundary 68. The six fins 66a-66f are separated by an equal distance, i.e., the fin pitch, and situated on six equally spaced grid lines 42 of the equal fin grid structure 40. Each of the fins 66a-66f aligns with one of the grid lines 42. The cell boundary 68 spans about eleven grid spaces 44. Also, as illustrated the width We of the cell boundary 68 of the long channel finfet 36 is wider than the width Wm of the cell boundaries 50, 56, and 62 of the other finfet cells 30, 32, and 34, respectively.

The finfet cell 38 is designed using the digital circuit design rules and the digital fin boundary, instead of the analog circuit design rules and the analog fin boundary. The finfet cell 38 includes four active areas or fins 70a-70d and a gate 72 situated within a cell boundary 74. Each of the four fins 70a-70d includes a source region 76 on one side of the gate 72, such as the left side, and a drain region 78 on the other side of the gate 72, such as the right side. In other embodiments, the source region 76 can be on the right side of the gate 72 and the drain region 78 can be on the left side of the gate 72. Also, in other embodiments, the finfet cell 38 can include fewer than four fins 70a-70d or more than four fins 70a-70d.

The fins 70a-70d of the finfet cell 38, designed using digital circuit design rules and the digital fin boundary, do not align with and are not situated on the grid lines 42 of the equal fin grid 40. Instead, the fins 70a-70d are situated between or interleaved with the grid lines 42 of the equal fin grid 40. Also, the finfet cell 38 has the same fin formation or boundary as that of a digital logic cell designed using the digital fin boundary. The finfet cell 38 has two fins 70a and 70b on a top portion 80 of the finfet cell 38 and two fins 70c and 70d on a bottom portion 82 of the finfet cell 38. Between the top portion 80 and the bottom portion 82 is a middle portion 84 that does not have any fins, which allows for routing metal lines through the finfet cell 38 or to the gate 72 of the finfet cell 38.

In embodiments, with the fins 70a-70d situated between the grid lines 42 and with the finfet cell 38 having a middle portion 84 that does not have any fins, the efficiency of space usage in and through the finfet cell 38 can be increased, such that the device size can be made smaller. Also, the cell boundary 74 spans about seven grid spaces 44, which is two less than the cell boundary 56 of finfet cell 32, which also has four fins. In embodiments, with the fins 70a-70d situated between the grid lines 42, the height H of the finfet cell 38 can be reduced or decreased in relation to a finfet cell designed using analog circuit design rules and the analog fin boundary, such that the device size can be made smaller.

FIG. 3 is a table 100 illustrating dimensions of some characteristics of the finfet cells 30, 32, 34, and 36 that are designed using the analog fin boundary and finfet cells 38a and 38b that are designed using the digital fin boundary, in accordance with some embodiments. The finfet cells 30, 32, 34, and 36 are described in detail above, such that the description will not be repeated here. The finfet cell 38a is designed and manufactured with a large CPP and the finfet cell 38b is designed and manufactured with a minimal CPP. Otherwise, each of the finfet cells 38a and 38b is like the finfet cell 38 described in detail above, such that the description will not be repeated here for the finfet cells 38a and 38b.

The table 100 compares the finfet cells 30, 32, 34, 36, 38a, and 38b in relation to a voltage 102 measured in volts (V), cell height 104 measured in nanometers (nm), fin density in the Y, i.e., vertical, direction 106 measured in fin/height-in-nm, channel length (Lg) 108 measured in nm, CPP 110 measured in nm, and Lg/CPP 112.

As indicated, in some embodiments, the voltage 102 of the long channel finfet cell 36 ranges from 1.1 V to 1.8 V, and in some embodiments the voltage 102 of the long channel finfet cell 36 is less than 1.1 V. This can be compared to the voltage 102 of the finfet cells 30, 32, 34, 38a, and 38b, which is less than 1.1 V. Thus, in some embodiments, the long channel finfet cell 36 can have a higher voltage 102.

The cell height 104 of all the finfet cells 30, 32, 34, and 36 designed using the analog boundary ranges from 0.5 times a reference value to 5 times the reference value, and the cell height 104 of each of the finfet cells 38a and 38b designed using the digital fin boundary is at the reference value.

The fin density in the Y direction 106 of the finfet cell 38a that is designed with the digital fin boundary and the large CPP ranges from 95% to 50%, and the fin density in the Y direction 106 of the finfet cell 38b that is designed with the digital fin boundary and the minimum CPP is at a reference value.

The Lg 108 of the long channel finfet cell 36 ranges from 1.2 times a reference value to 80 times the reference value and the Lg for the remainder of the finfet cells 30, 32, 34, 38a, and 38b is at a minimal channel length reference value.

The CPP 110 of the long channel finfet cell 36 ranges from 2 times a reference value to 5 times the reference value and the CPP of the other finfet cells 30, 32, and 34 designed using the analog fin boundary ranges from 1 times the reference value to 2 times the reference value. The CPP 110 for the finfet cell 38a designed with the digital fin boundary and the large CPP ranges from 1.05 times the reference value to 2 times the reference value and the CPP 110 of the finfet cell 38b designed with the digital fin boundary and the minimum CPP is at the reference value.

The Lg/CPP 112 of the long channel finfet cell 36 ranges from 20% to 90%, the Lg/CPP 112 of the other finfet cells 30, 32, and 34 designed with the analog fin boundary are at the reference level, the Lg/CPP 112 of the finfet cell 38a ranges from 4% to 35%, and the Lg/CPP 112 of the finfet cell 38b ranges from 5% to 30%.

The long channel finfet cell 36 is designed and manufactured using the analog circuit design rules and the analog fin boundary to provide long channel finfets that have higher active area or fin densities, lower noise levels, and thicker oxide layers such that the long channel finfet 36 can bear higher voltages and are well suited for use in IO devices.

The finfet cells 38a and 38b are designed and manufactured using the digital circuit design rules and the digital fin boundary to have a higher GM and a higher UGF, as described above. In some embodiments, the finfets 38a and 38b have a smaller cell size that saves space and results in shorter metal tracks, which increases the maximum EM current.

Figure 4:
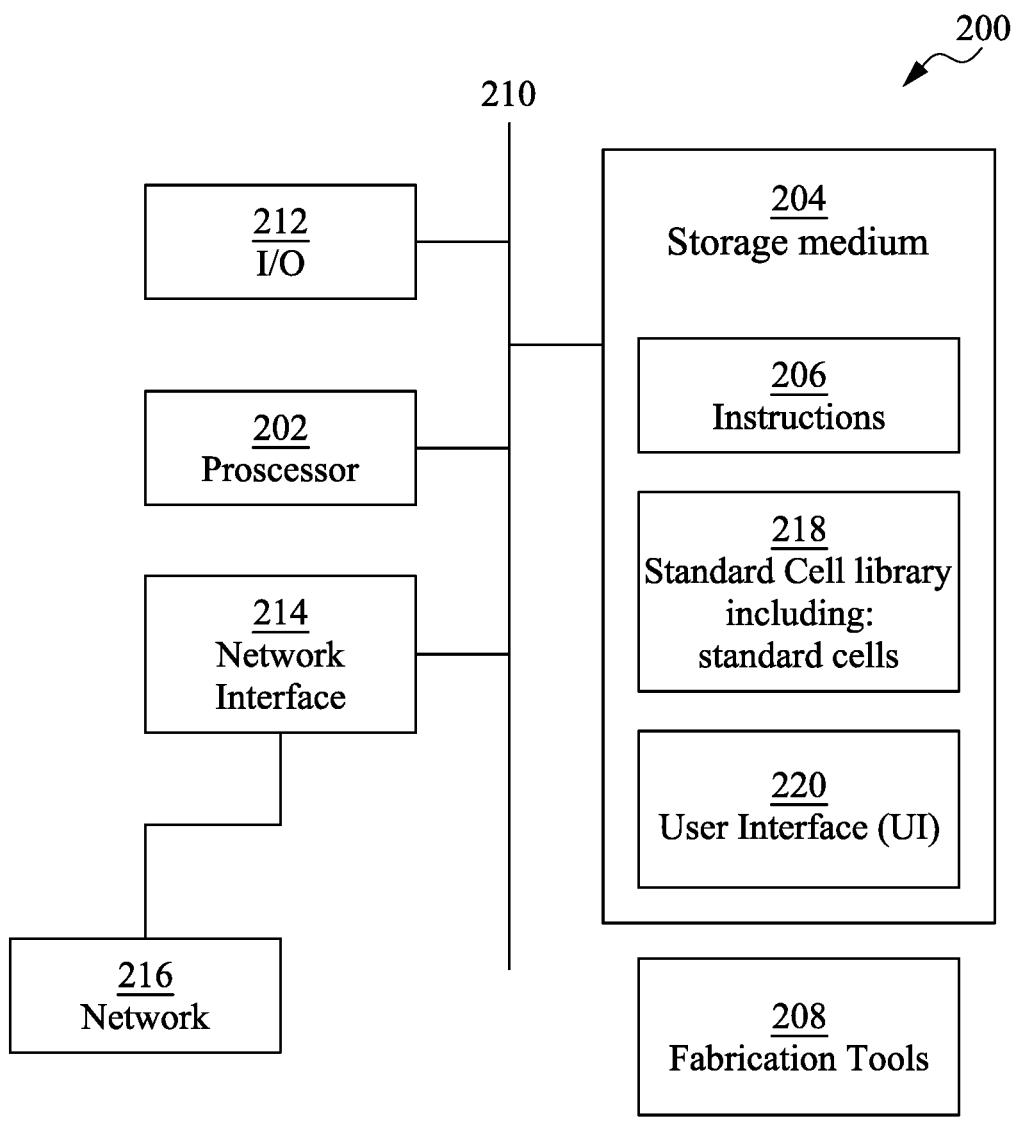
FIG. 4 is a block diagram illustrating an example of a computer system configured to design and manufacture the cells and circuits of this disclosure, in accordance with some embodiments.

Some or all the design and manufacture of the finfet cells and circuits described herein can be performed by or with a computer system, such as an EDA system. FIG. 4 is a block diagram illustrating various aspects of an EDA system 200 configured to be used to perform some or all the design and manufacture of the finfet cells and circuits described herein, in accordance with the present disclosure.

In some embodiments, the EDA system 200 includes an automated place and route (APR) system. In some embodiments, the EDA system 200 is a general-purpose computing device including a processor 202 and a non-transitory, computer-readable storage medium 204. The computer-readable storage medium 204 may be encoded with, e.g., store, computer program code such as a set of executable instructions 206. Execution of the instructions 206 by the processor 202 represents (at least in part) an EDA tool that implements a portion or all of the functions of the system 200, such as providing layouts using the analog and digital circuit design rules and processes described herein. Further, fabrication tools 208 are included to layout and physically implement the design and manufacture of the layouts.

The processor 202 is electrically coupled to the computer-readable storage medium 204 by a bus 210 and to an I/O interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all of the functions of the system 200, such as providing layouts using the analog and digital circuit design rules and processes described herein and other functions of the system 200. In embodiments, the processor 202 is a central processing unit (CPU), a multi-processor, a distributed processing system, an application specific integrated circuit (ASIC), and/or a suitable processing unit.

In embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random access memory (RAM), a read-only memory (ROM), a rigid magnetic disk, and/or an optical disk. In embodiments using optical disks, the computer-readable storage medium 204 can include a compact disk, read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all of the functions of the system 200, such as providing layouts using the analog and digital circuit design rules and processes described herein and other functions of the system 200. In some embodiments, the computer-readable storage medium 204 also stores information which facilitates performing a portion or all the functions of the system 200. In some embodiments, the computer-readable storage medium 204 stores a standard cell library 218 that includes standard logic cells.

The EDA system 200 includes the I/O interface 212, which is coupled to external circuitry. In embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of standard cells, and/or other parameters for processing by processor 202. The information is transferred to the processor 202 by the bus 210. Also, the EDA system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the EDA system 200. In some embodiments, a layout diagram which includes standard cells is generated using a tool such as VIRTUOSO available from CADENCE DESIGN SYSTEMS, Inc., or another suitable layout generating tool.

In some embodiments, the layouts and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a DVD, a magnetic disk such as a hard disk, a semiconductor memory such as a ROM and RAM, and a memory card, and the like.

As noted above, embodiments of the EDA system 200 include fabrication tools 208 for implementing the manufacturing processes of the system 200. For example, a synthesis may be performed on a design in which the behavior and/or functions desired from the design are transformed to a functionally equivalent logic gate-level circuit description by matching the design to standard cells selected from the standard cell library 218. This synthesis results in a functionally equivalent logic gate-level circuit description, such as a gate-level netlist. Based on the gate-level netlist, a photolithographic mask may be generated that is used to fabricate the IC by the fabrication tools 208.

Figure 5:
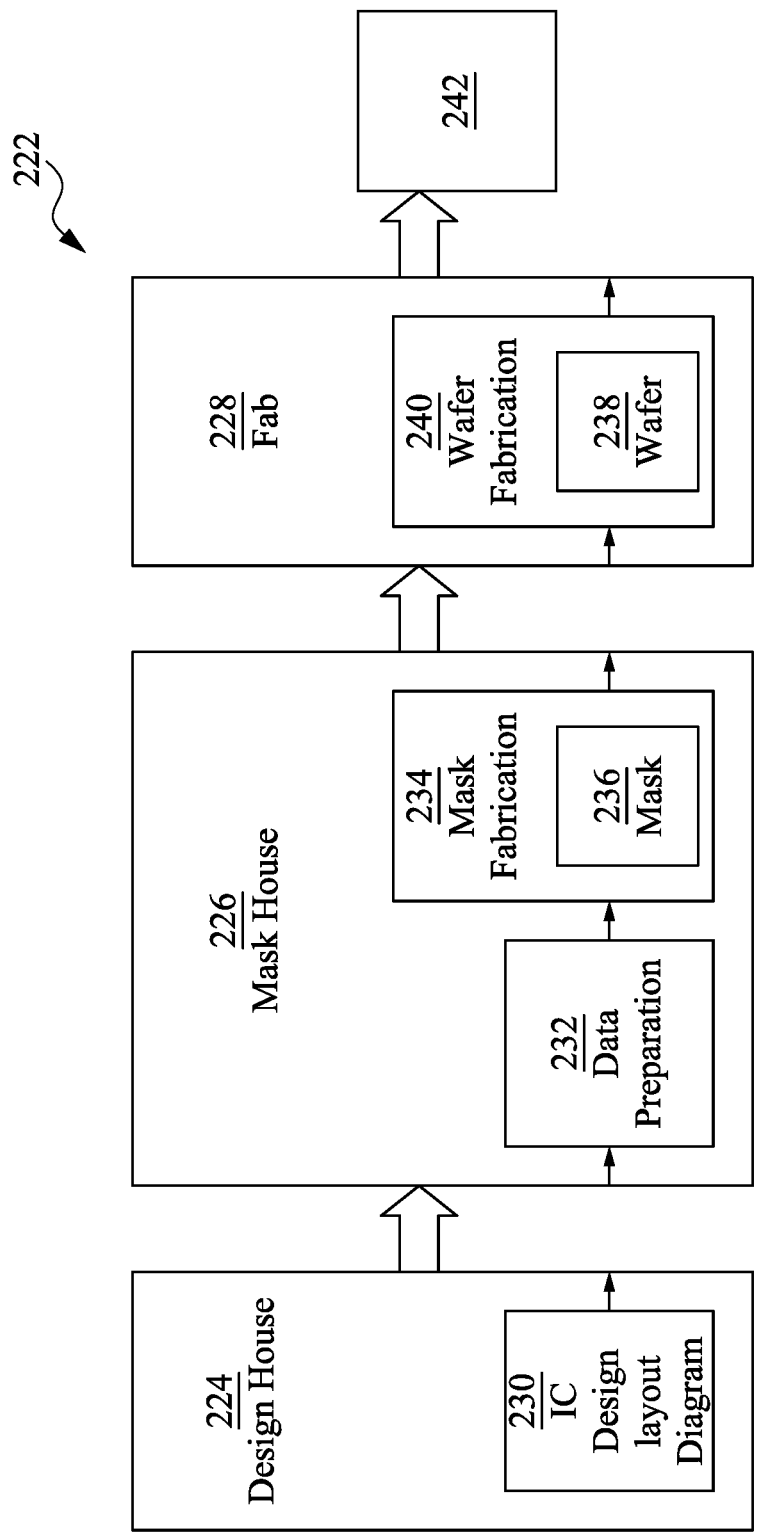
FIG. 5 is a block diagram of an integrated circuit (IC) manufacturing system and an IC manufacturing flow associated therewith, in accordance with some embodiments.

Further aspects of device fabrication are disclosed in conjunction with FIG. 5, which is a block diagram of an IC manufacturing system 222 and an IC manufacturing flow associated therewith, in accordance with some embodiments. In some embodiments, based on a layout diagram, one or more semiconductor masks and/or at least one component in a layer of a semiconductor IC is fabricated using the manufacturing system 222.

In FIG. 5, the IC manufacturing system 222 includes entities, such as a design house 224, a mask house 226, and an IC manufacturer/fabricator ("fab") 228, that interact with one another in the design, development, and manufacturing cycles and/or services related to manufacturing an IC, such as the circuits described herein. The entities in the system 222 are connected by a communications network. In some embodiments, the communications network is a single network. In some embodiments, the communications network is a variety of different networks, such as an intranet and the internet. The communications network includes wired and/or or wireless communication channels. Each entity interacts with one or more of the other entities and provides services to and/or receives services from one or more of the other entities. In some embodiments, two or more of the design house 224, the mask house 226, and the IC fab 228 are owned by a single larger company. In some embodiments, two or more of the design house 224, the mask house 226, and the IC fab 228 coexist in a common facility and use common resources.

The design house (or design team) 224 generates an IC design layout diagram 230. The IC design layout diagram 230 includes various geometrical patterns, or IC layout diagrams designed for an IC device, such as the devices designed with the analog circuit design rules and the analog fin boundary and/or the digital circuit design rules and the digital fin boundary. The geometrical patterns correspond to patterns of metal, oxide, or semiconductor layers that make up the various components of the semiconductor structures to be fabricated. The various layers combine to form various IC features. For example, a portion of the IC design layout diagram 230 includes various IC features, such as active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form an IC design layout diagram 230. The design procedure includes one or more of analog circuit design, digital logic circuit design, physical layout designs, and place and route routines. The IC design layout diagram 230 is presented in one or more data files having information of the geometrical patterns. For example, IC design layout diagram 230 can be expressed in a GDSII file format or DFII file format.

The mask house 226 includes data preparation 232 and mask fabrication 234. The mask house 226 uses the IC design layout diagram 230 to manufacture one or more masks 236 to be used for fabricating the various layers of the IC or semiconductor structure. The mask house 226 performs mask data preparation 232, where the IC design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the IC fab 228. In FIG. 5, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the IC design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the IC design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the IC fab 228. LPC simulates this processing based on the IC design layout diagram 230 to create a simulated manufactured device. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 230.

The above description of mask data preparation 232 has been simplified for the purposes of clarity. In some embodiments, data preparation 232 includes additional features such as a logic operation (LOP) to modify the IC design layout diagram 230 according to manufacturing rules. Additionally, the processes applied to the IC design layout diagram 230 during data preparation 232 may be executed in a variety of different orders.

After the mask data preparation 232 and during the mask fabrication 234, a mask 236 or a group of masks 236 are fabricated based on the modified IC design layout diagram 230. In some embodiments, the mask fabrication 234 includes performing one or more lithographic exposures based on the IC design layout diagram 230. In some embodiments, an electron-beam (e-beam) or a mechanism of multiple e-beams is used to form a pattern on a mask (photomask or reticle) 236 based on the modified IC design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The IC fab 228 includes wafer fabrication 240. The IC fab 228 is an IC fabrication business that includes one or more manufacturing facilities for the fabrication of a variety of different IC products. In some embodiments, the IC fab 228 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 228 uses the mask(s) 236 fabricated by the mask house 226 to fabricate the semiconductor structures or ICs 242 of the current disclosure. Thus, the IC fab 228 at least indirectly uses the IC design layout diagram 230 to fabricate the semiconductor structures or ICs 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the IC fab 228 using the mask(s) 236 to form the semiconductor structures or ICs 242 of the current disclosure. In some embodiments, the IC fabrication includes performing one or more lithographic exposures based at least indirectly on the IC design layout diagram 230.

In some embodiments, the EDA system 200 and the IC manufacturing system 222 are configured to design and manufacture the finfet cells 30, 32, 34, and 36 that are designed and manufactured using the analog circuit design rules and the analog fin boundary. In addition, in embodiments, these finfet cells 30, 32, 34, and 36 are designed into circuits, such as analog circuits, digital circuits, mixed analog and digital circuits, and serdes circuits.

In some embodiments, the EDA system 200 and the IC manufacturing system 222 are configured to design and manufacture the finfet cells 38, including the finfet cells 38a and 38b, that are designed and manufactured using the digital circuit design rules and the digital fin boundary, instead of the analog circuit design rules and the analog fin boundary. In embodiments, these finfet cells 38, including finfet cells 38a and 38b, are referred to herein as analog cells that were previously designed using the analog circuit design rules and the analog fin boundary, but are now designed using the digital circuit design rules and the digital fin boundary. In embodiments, these analog cells are designed into circuits, such as analog circuits, digital circuits, a mixture of analog and digital circuits, and serdes circuits, which were previously designed using the analog circuit design rules and the analog fin boundary.

Figure 6:
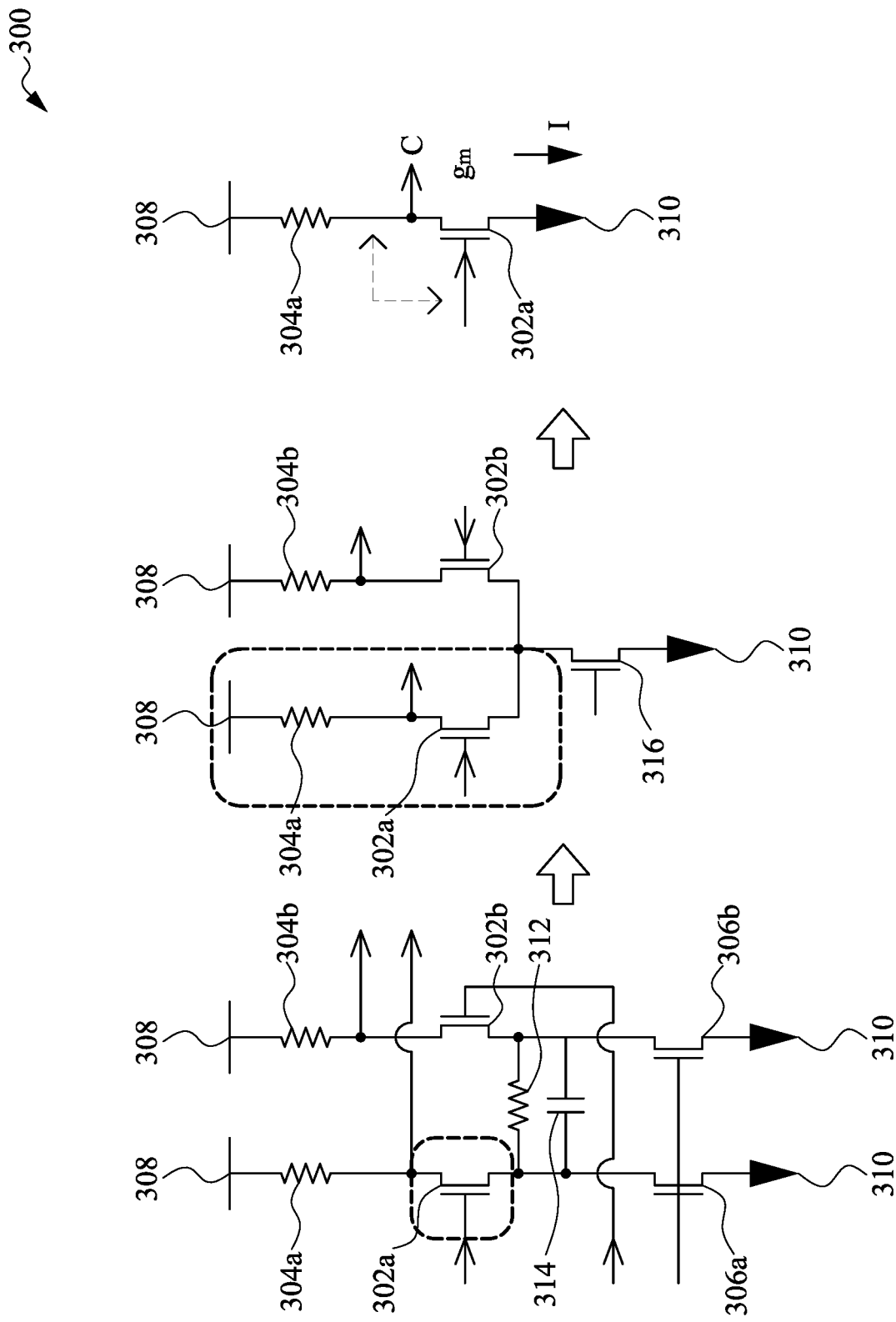
FIG. 6 is a diagram schematically illustrating a current mode logic circuit that includes analog cells that are designed and manufactured using the digital fin boundary as switching transistors, in accordance with some embodiments.

FIG. 6 is a diagram schematically illustrating a current mode logic circuit 300 that includes analog finfet cells that are designed and manufactured using the digital fin boundary and used as switching transistors 302a and 302b, in accordance with some embodiments. The switching transistors 302a and 302b are configured to have higher GM, higher UGF, and higher maximum EM currents. In embodiments, the switching transistors 302a and 302b are like finfet cells 38.

The switching transistor 302a has one side of its drain/source path electrically coupled to one side of a resistor 304a and the other side of its drain/source path electrically coupled to one side of the drain/source path of a current source transistor 306a. Also, the switching transistor 302b has one side of its drain/source path electrically coupled to one side of a resistor 304b and the other side of its drain/source path electrically coupled to one side of the drain/source path of a current source transistor 306b. The other sides of the resistors 304a and 304b are electrically coupled to a power source 308, such as VDD, and the other sides of the drain/source paths of the current source transistors 306a and 306b are electrically coupled to a reference 310, such as ground. A resistor 312 and a capacitor 314 are electrically coupled in parallel between the sides of the drain/source paths of the switching transistors 302a and 302b that are electrically coupled to the drain/source paths of the current source transistors 304a and 304b, as shown.

In the current mode logic circuit 300, key performance indicators (KPI) include the UGF, which is defined as the gain times the bandwidth. To determine an equation for UGF, the current mode logic circuit 300 can be first reduced to the switching transistors 302a and 302b and the resistors 304a and 304b electrically coupled to one current source transistor 316. The switching transistor 302a has one side of its drain/source path electrically coupled to one side of resistor 304a and the other side of its drain/source path electrically coupled to one side of the drain/source path of the current source transistor 316. Also, the switching transistor 302b has one side of its drain/source path electrically coupled to one side of resistor 304b and the other side of its drain/source path electrically coupled to the one side of the drain/source path of the current source transistor 316. The other sides of the resistors 304a and 304b are electrically coupled to the power source 308 and the other side of the current source transistor 312 is electrically coupled to the reference 310.

This can be further reduced to highlight one side of the switching transistor 302a electrically coupled to one side of the resistor 304a. With the other side of the resistor 304a electrically coupled to power 308 and the other side of the drain/source path of the switching transistor 302a electrically coupled to the reference 310 and providing a current I. In this configuration, the gain times the bandwidth is equal to $(GM*R)/(R*C)$, where GM is the transconductance of the switching transistor 302a, R is the resistance of the resistor 304a, and C is the load capacitance at the output of the switching transistor 302a. Of course, this equation reduces to UGF=GM/C.

In embodiments, the current mode switching transistors 302a and 302b need to have higher GM, higher UGF, and higher maximum EM currents for switching at higher and higher speeds. The finfet cells 38 designed with the digital circuit design rules and the digital fin boundary are well suited for being switching transistors 302a and 302b, since, in some embodiments, they have higher GM, higher UGF, and higher maximum EM currents. In some embodiments, the GM is higher since resistance is lower in the MEOL (as described below), the UGF=GM/C is higher since the GM is higher and the MEOL capacitance C is lower with the smaller cell size of the finfet cells 38. Also, the maximum EM current is higher with shorter metal line lengths, where the digital circuit design rules allow M0 to be cut making shorter M0 lines and the cells have a shorter cell height that results in shorter M1 lines.

Figure 7:
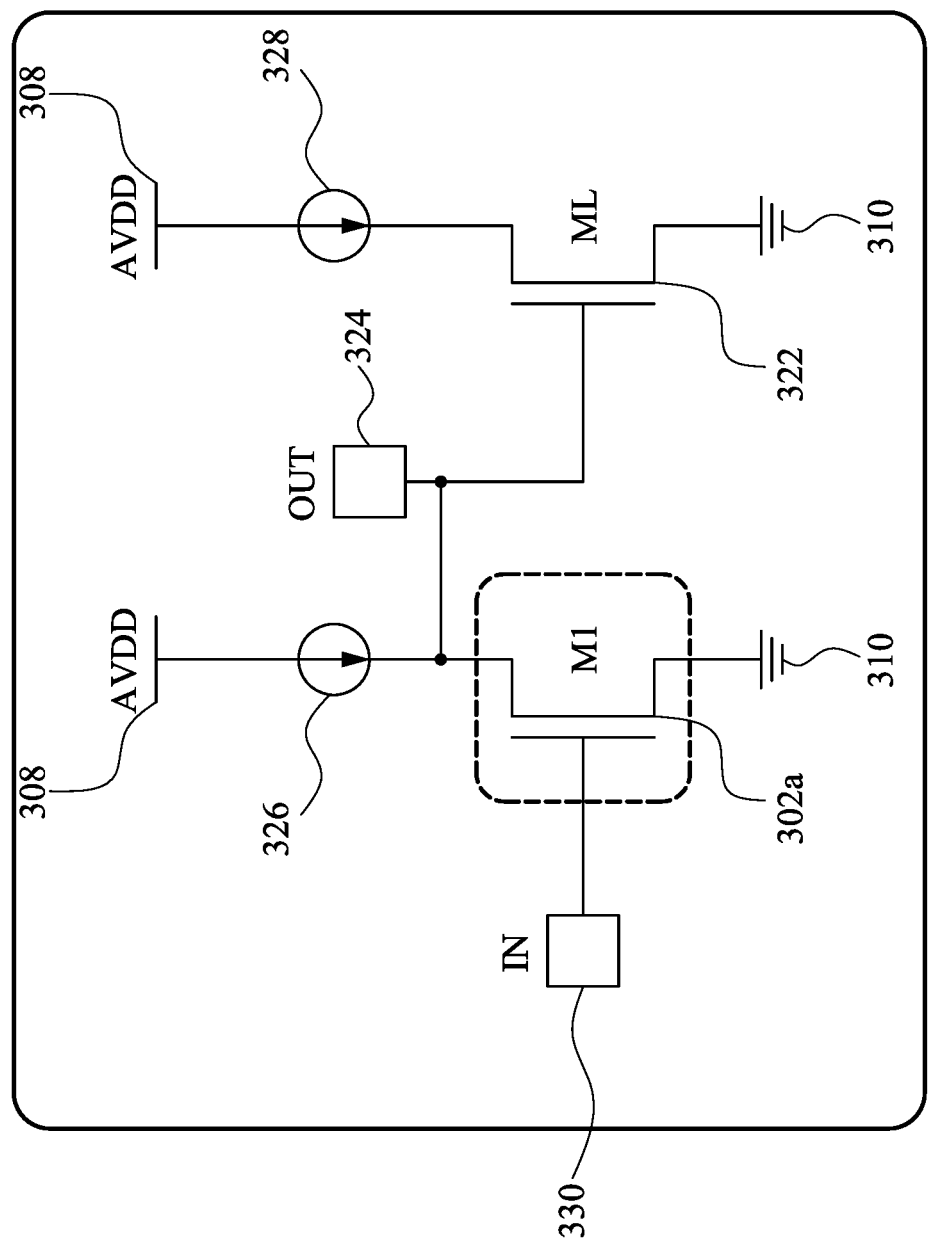
FIG. 7 is a diagram schematically illustrating a test-kit circuit for determining the UGF of the switching transistors shown in FIG. 6, in accordance with some embodiments.

FIG. 7 is a diagram schematically illustrating a test-kit circuit 320 for determining the UGF of the switching transistor 302a, in accordance with some embodiments. The test-kit circuit 320 includes the switching transistor 302a and a load transistor 322.

One side of the drain/source path of the switching transistor 302a is electrically coupled to the gate of the load transistor 322, an output pad 324, and to one side of a first current source 326. The other side of the first current source 326 is electrically coupled to power 308 and the other side of the drain/source path of the switching transistor 302a is electrically coupled to the reference 310, such as ground. Also, one side of the drain/source path of the load transistor 322 is electrically coupled to one side of a second current source 328. The other side of the second current source 328 is electrically coupled to power 308 and the other side of the drain/source path of the load transistor 322 is electrically coupled to the reference 310. The gate of the switching transistor 302a is electrically coupled to an input pad 330.

In operation, a small signal is applied to the input pad 330 at the gate of the switching transistor 302a, and the output of the test-kit circuit 320 is measured at the output pad 324.

Figure 8:
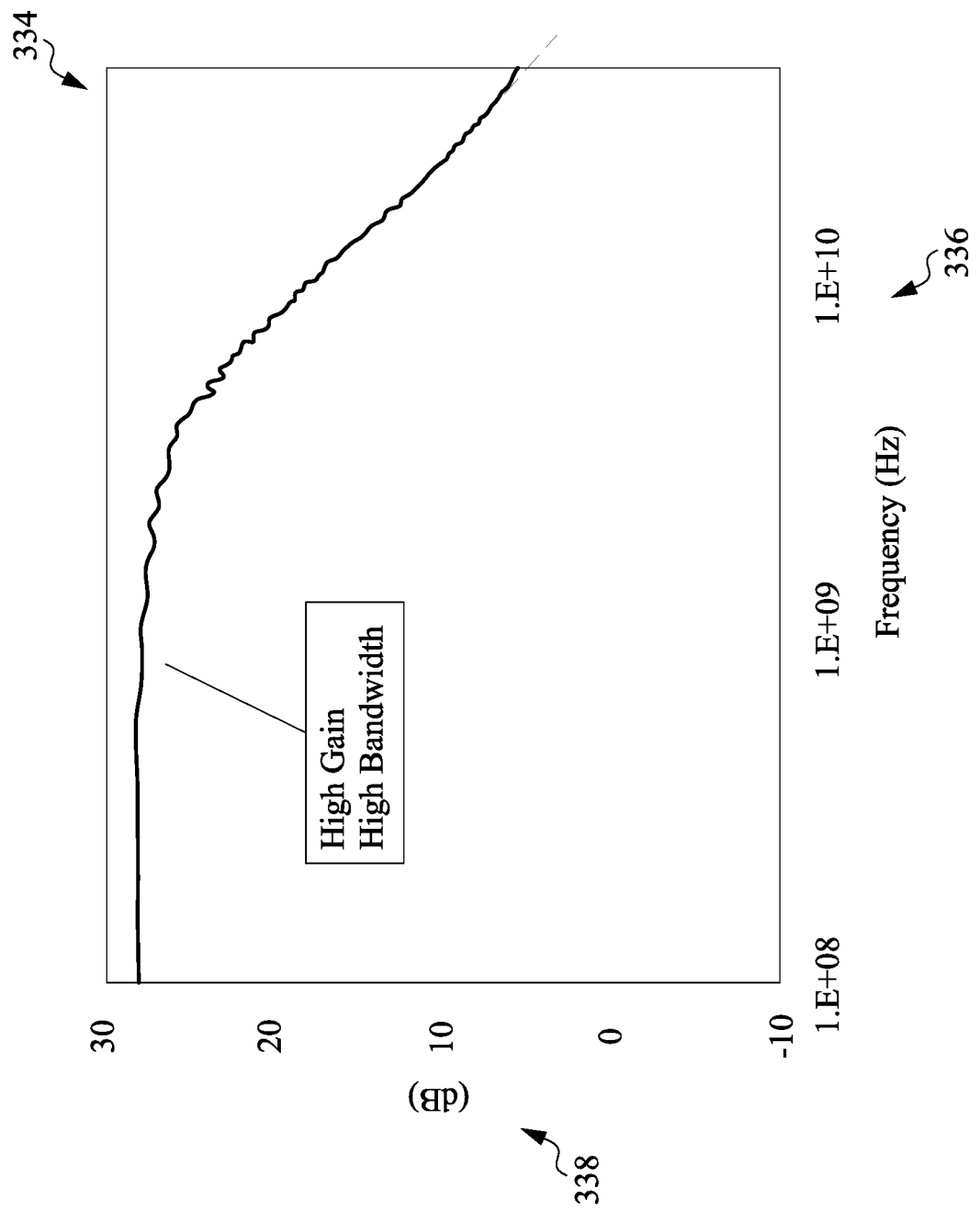
FIG. 8 is a graph illustrating gain versus frequency of the switching transistors as measured using the test-kit circuit of FIG. 7, in accordance with some embodiments.

FIG. 8 is a graph 334 illustrating the gain versus the frequency as measured using the test-kit circuit 320 of FIG. 7, in accordance with some embodiments. The graph 334 includes the frequency in hertz (Hz) on the x-axis 336 versus the gain in decibels (dB) on the y-axis 338. As illustrated, the switching transistor 302a has a high gain and a high bandwidth, where the gain is just below 30 dB before dropping and the bandwidth is greater than 1 gigahertz before the gain drops.

Figure 9:
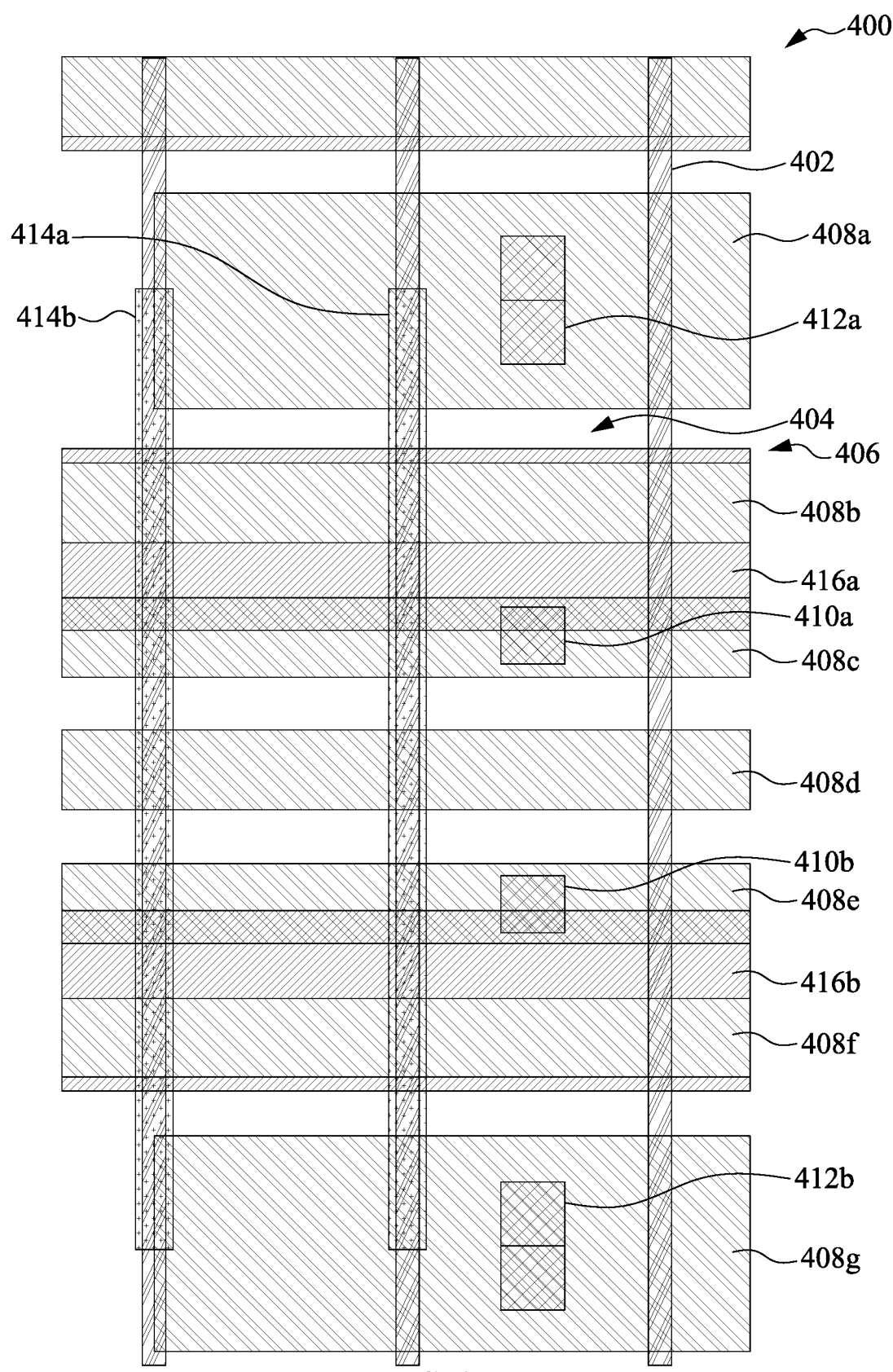
FIG. 9 is a diagram schematically illustrating a finfet cell that is designed and manufactured using the digital circuit design rules and the digital fin boundary and including middle end of line (MEOL) layers that are not included in circuits designed and manufactured using the analog fin boundary, in accordance with some embodiments.

FIG. 9 is a diagram schematically illustrating a finfet cell 400 that is designed and manufactured using the digital circuit design rules and the digital fin boundary and including MEOL layers that are not included in circuits designed and manufactured using the analog fin boundary, in accordance with some embodiments. The MEOL layers are configured to increase the GM and the UGF of the finfet cell 400. In embodiments, finfet cells like finfet cell 400 can be used as switching transistors 302a and 302b in the current mode logic 300. In embodiments, the finfet cell 400 can be used in analog circuits, digital circuits, a mixture of analog and digital circuits, and in serdes circuits, which were previously designed using the analog circuit design rules and the analog fin boundary. In some embodiments, the finfet cell 400 is like the finfet cell 38.

The finfet cell 400 includes a gate 402, a source region 404 on the left side of the gate 402, and a drain region 406 on the right side of the gate 402. In embodiments, the source region 404 and the drain region 406 can be switched, such that the source region 404 is on the right side of the gate 402 and the drain region 406 is on the left side of the gate 402.

The MEOL layers include M0 lines 408a-408g, smaller source/drain contacts VD 410a and 410b, larger source/drain contacts VD2 412a and 412b and cut PODE 414a and 414b. Each of the cut PODE 414a and 414b is filled with a high-K dielectric, which reduces leakage and provides for better isolation of the finfet cell 400. In embodiments, the MEOL layers include third level metal (M2) lines 416a and 416b.

The M0 lines 408a and 408g are wider metal lines that are less resistive per unit length than the narrower metal lines of M0 lines 408b-408f. In embodiments, the wider metal lines M0 408a and 408g range in width from 10 nm to 50 nm and the narrower metal lines M0 408b-408f range in width from 6 nm to 20 nm.

The source region 404 is electrically coupled to M0 408a through VD2 412a, to M0 408c through VD 410a, to M0 408e through VD 410b, and to M0 408g through VD2 412b. Each of the VD2s 412a and 412b is larger in size than each of the VDs 410a and 410b. In some embodiments, VD2 ranges from 8 nm×8 nm to 24 nm×24 nm and VD ranges from 6 nm×6 nm to 20 nm×20 nm.

VD2 contacts the wider metal lines 408a and 408g and VD contacts the narrower metal lines 408c and 408e. In embodiments, the VD2 412a and 412b are only allowed when the digital circuit design rules and the digital fin boundary are used to design the finfet cells. Thus, analog circuits designed and manufactured using the digital circuit design rules and the digital fin boundary can include VD2 to improve performance, where the resistance of VD2 is at least 50% lower than the resistance of VD. Using VD2 contacts increases on current Ion and the GM, which lowers the IR voltage drop through the finfet 400.

Figure 10:
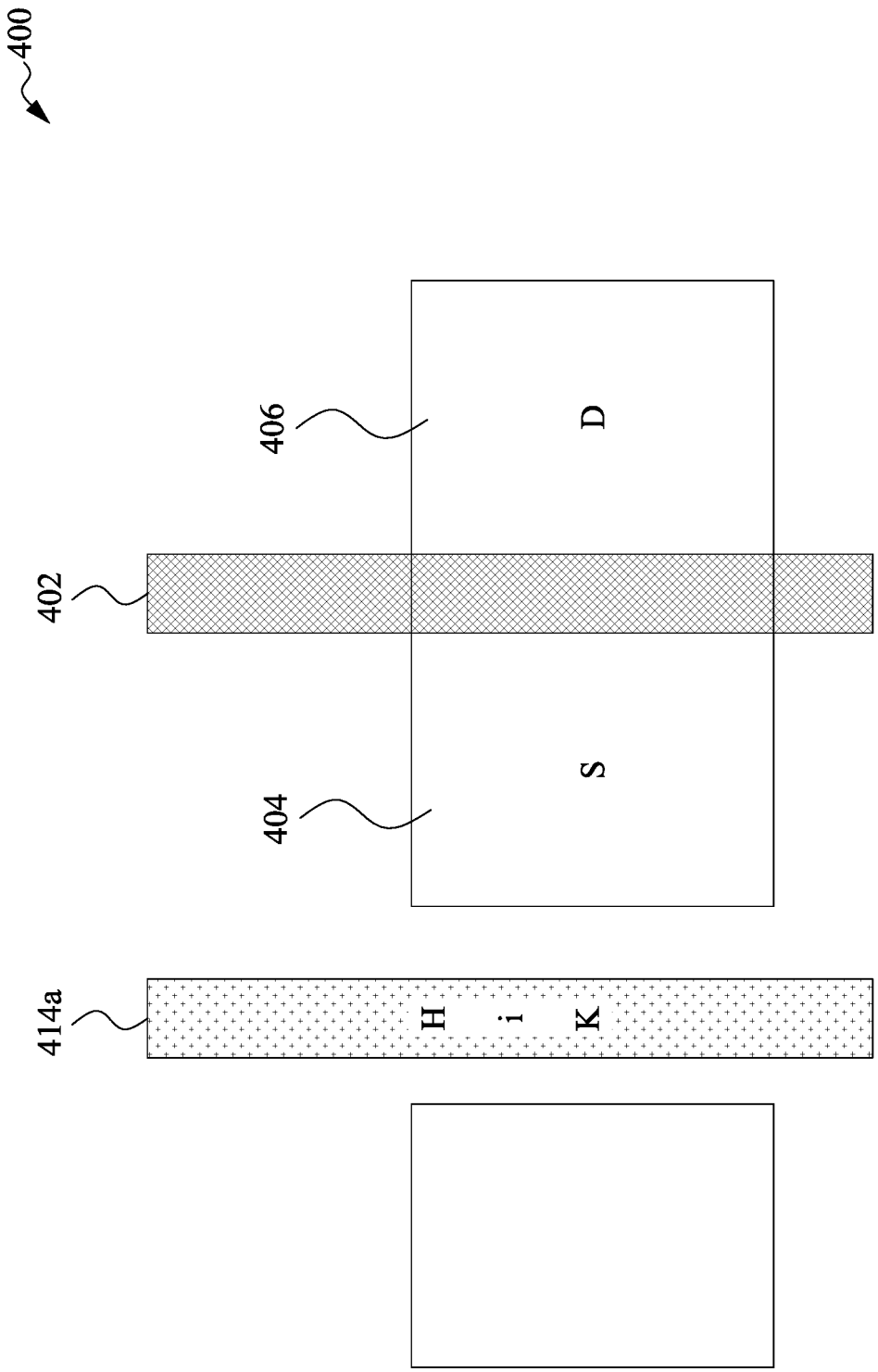
FIG. 10 is a diagram schematically illustrating the finfet cell of FIG. 9 including cut poly on the oxide diffusion edge (cut PODE), in accordance with some embodiments.

FIG. 10 is a diagram schematically illustrating the finfet cell 400 including the cut PODE 414a, in accordance with some embodiments. The finfet cell 400 includes the gate 402 including poly over the fin active areas, the source region 404 on the left side of the gate 402, and the drain region 406 on the right side of the gate 402. The cut PODE 414a is filled with high-K dielectric, which reduces leakage from the finfet cell 400 and provides for better isolation of the finfet cell 400.

Figure 11:
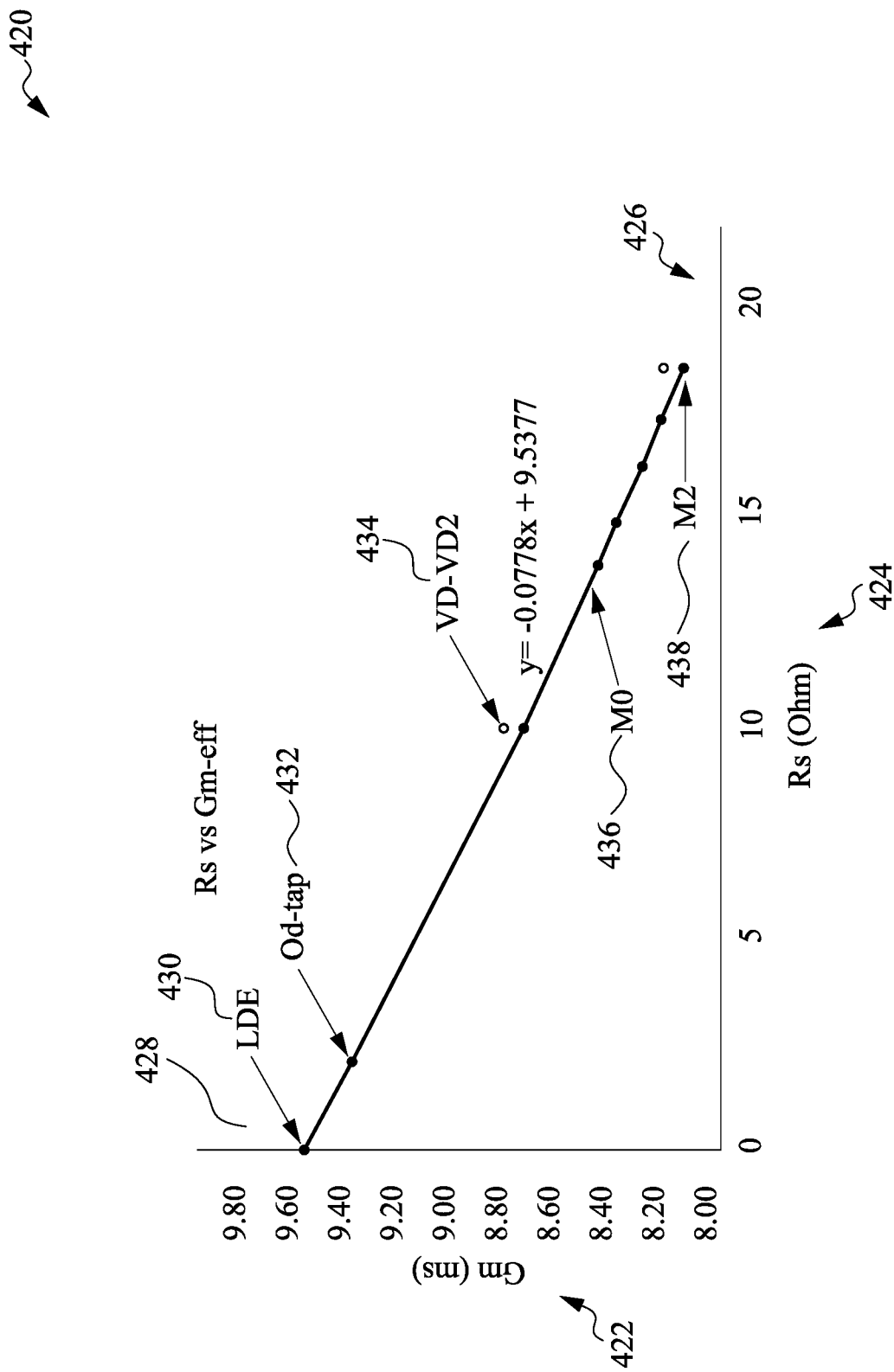
FIG. 11 is a graph illustrating the effective GM of the finfet cell of FIG. 9 versus the resistance through the finfet cell, in accordance with some embodiments.

FIG. 11 is a graph 420 illustrating the effective GM 422 of the finfet cell 400 versus the resistance Rs 424 through the finfet cell 400, in accordance with some embodiments. The graph 420 includes the resistance Rs 424 measured in Ohms on the x-axis 426 and the effective GM 422 measured in milli-siemens (mS) on the y-axis 428.

As illustrated, the effective GM 422 is highest at about 9.6 mS where layout dependent effects (LDE) 430 affect the GM 422. The GM 422 decreases to about 9.4 mS as the resistance Rs 424 includes the OD-tap 432; to about 8.8 mS as the resistance Rs 424 includes the VD-VD2 contacts 434; to about 8.4 mS as the resistance Rs 424 includes M0 lines 436; and to about 8.1 mS as the resistance Rs 424 includes the M2 lines 438. In embodiments, the effective GM decreases according to a straight-line equation of $y=-0.0778x+9.5377$ as resistance Rs 424 increases.

In another aspect of the finfet cells described herein, the finfet cells 30, 32, 34, and 36 that are designed and manufactured using the analog circuit design rules and the analog fin boundary are used in the serdes circuit 20 of FIG. 1. For example, the long channel finfet cell 36 can be used in I/O devices and as long channel transistors in the serdes circuit 20.

Figure 12:
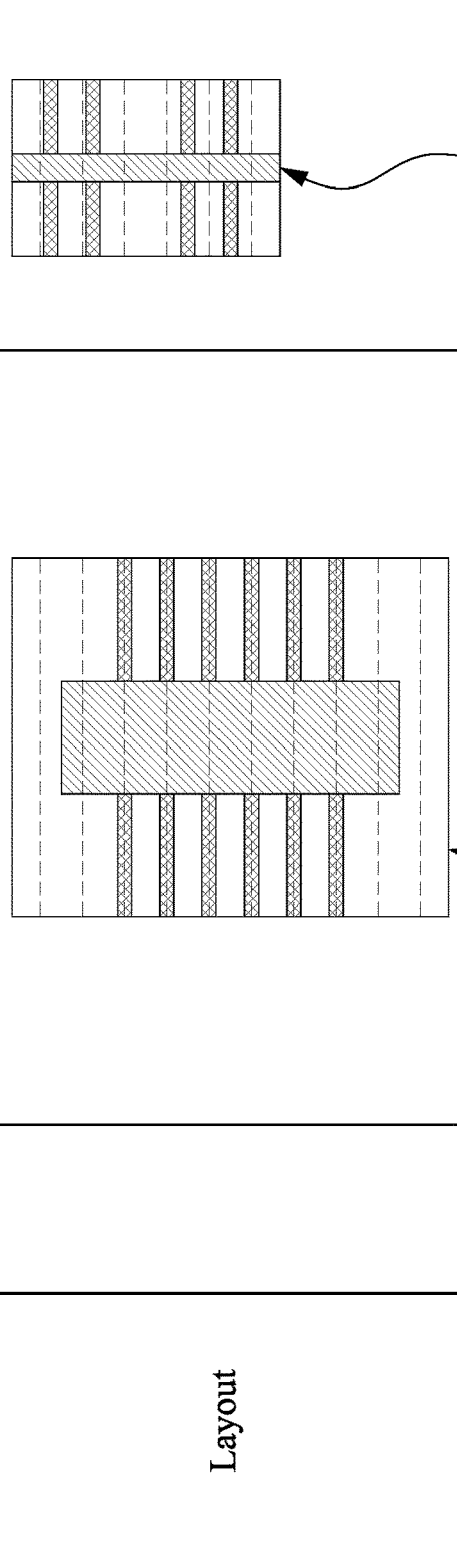
FIG. 12 is a table illustrating dimensions of certain characteristics of a long channel finfet cell designed and manufactured using the analog circuit design rules and the analog fin boundary and a finfet cell designed and manufactured using the digital circuit design rules and the digital fin boundary, in accordance with some embodiments.

FIG. 12 is a table 500 illustrating dimensions of some characteristics of a long channel finfet cell 502 designed using the analog circuit design rules and the analog fin boundary and a finfet cell 504 designed using the digital circuit design rules and the digital fin boundary, in accordance with some embodiments. In some embodiments, the finfet cell 504 is designed using the digital circuit design rules and the digital fin boundary, instead of the analog circuit design rules and the analog fin boundary.

The table 500 lists dimensions for the finfet cells 502 and 504 in relation to a voltage 506 measured in volts V, cell height 508 measured in nm, fin density in the Y, i.e., vertical, direction 510 measured in fin/height-in-nm, channel length Lg 512 measured in nm, CPP 514 measured in nm, and Lg/CPP 516.

As indicated, in some embodiments, the voltage 506 of the long channel finfet cell 502 ranges from 1.1 V to 1.8 V, and in other embodiments the voltage 506 of the long channel finfet cell 502 is less than 1.1 V. This can be compared to the voltage 506 of the finfet cell 504, which is less than 1.1 V. Thus, in some embodiments, the long channel finfet cell 502 can have a higher voltage 506.

The cell height 508 of the long channel finfet cell 502 ranges from 0.5 times a reference value to 5 times the reference value, and the cell height 508 of the finfet cell 504 designed using the digital fin boundary is at the reference value. Thus, in some embodiments, the long channel finfet cell 502 has a cell height 508 that is greater than the cell height 508 of the finfet cell 504.

The fin density in the Y direction 510 of the finfet cell 504 is at a reference value. As illustrated, the fin density of the long channel finfet 502 is greater than the fin density of the finfet cell 504.

Also, the channel length Lg 512 of the long channel finfet cell 502 ranges from 1.2 times a reference value to 80 times the reference value, and the Lg for the finfet cell 504 is at a minimal channel length reference value. Thus . . . the channel length Lg in the long channel finfet cell 502 is greater than the channel length Lg of the finfet cell 504.

The CPP 514 of the long channel finfet cell 502 ranges from 2 times a reference value to 5 times the reference value and the CPP of the finfet cell 504 is at the reference value. Also, the Lg/CPP 516 of the long channel finfet cell 502 is at about 41% and the Lg/CPP of the finfet cell 504 is at a reference value.

The long channel finfet cell 502 designed with the analog fin boundary has a higher fin density and provides lower noise levels. In some embodiments, the long channel finfet cell 502 can bear a higher voltage, since the oxide layer is thicker. Also, to scale down area, decoupling capacitors use the higher fin density of the long channel finfet cell 502, and the Lg/CPP 516 of the long channel finfet cell 502 is higher, the capacitor density is higher. In some embodiments, the long channel finfet cell 502 is used in I/O devices.

Figure 13:
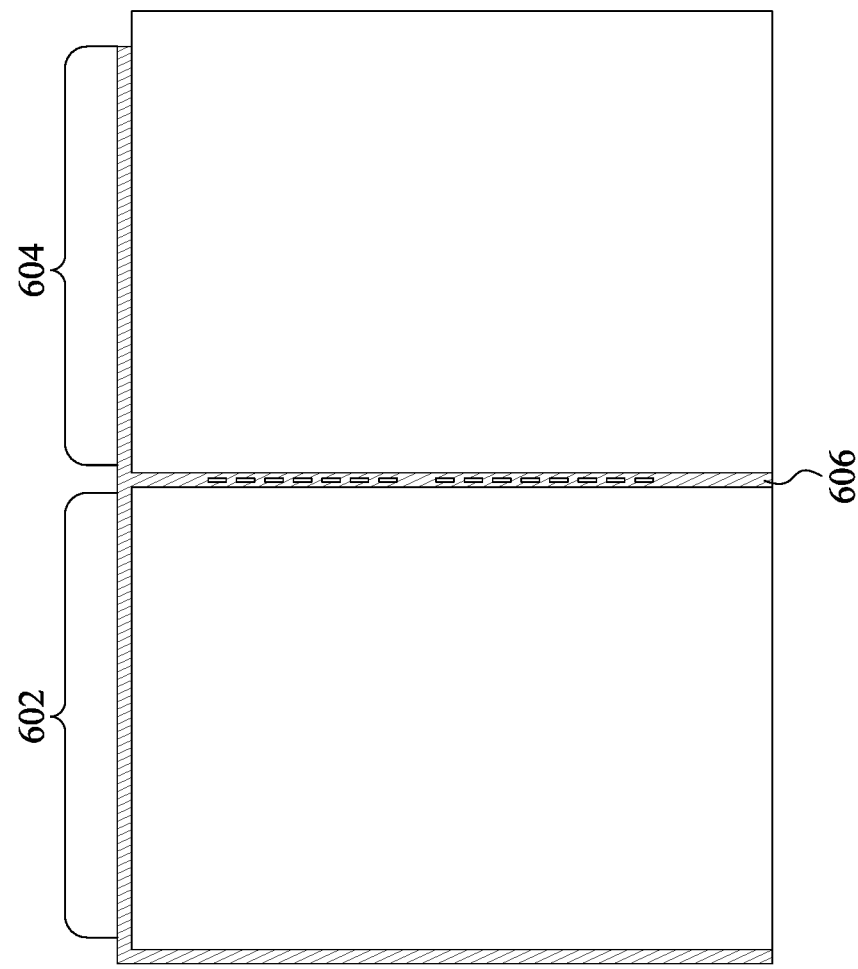
FIG. 13 is a diagram schematically illustrating an IC including analog cells designed and manufactured using the digital circuit design rules and the digital fin boundary and situated next to logic circuit cells, such as standard logic cells, designed and manufactured using the digital circuit design rules and the digital fin boundary, in accordance with some embodiments.

FIG. 13 is a diagram schematically illustrating an IC 600 including analog cells at 602 designed using the digital circuit design rules and the digital fin boundary and situated next to logic circuit cells 604, such as standard logic cells, designed using the digital circuit design rules and the digital fin boundary, in accordance with some embodiments. With the analog circuit cells 602 and the digital circuit cells 604 designed using the same digital circuit design rules and the same digital fin boundary, the cells 602 and 604 have the same fin formation or boundary and the same cell boundaries. Thus, the analog cells 602 can be situated directly adjacent and abutting at 606 the logic circuit cells 604, without including a keep-out zone or region between the analog cells 602 and the logic circuit cells 604. Otherwise, if the analog cells 602 and the logic cells 604 were designed using different fin boundaries, a keep-out zone would be provided between the two different cells where, in some embodiments, the keep-out zone ranges from 0.1 micrometer (um) to 10 um.

Not including a keep-out zone saves space and reduces the size of the IC 600. In addition, the digital fin boundary leaves a space between fins in the middle of the finfet cell, which can be used for routing. In some embodiments, using the space between fins for routing increases space usage and reduces the size of the IC 600.

Figure 14:
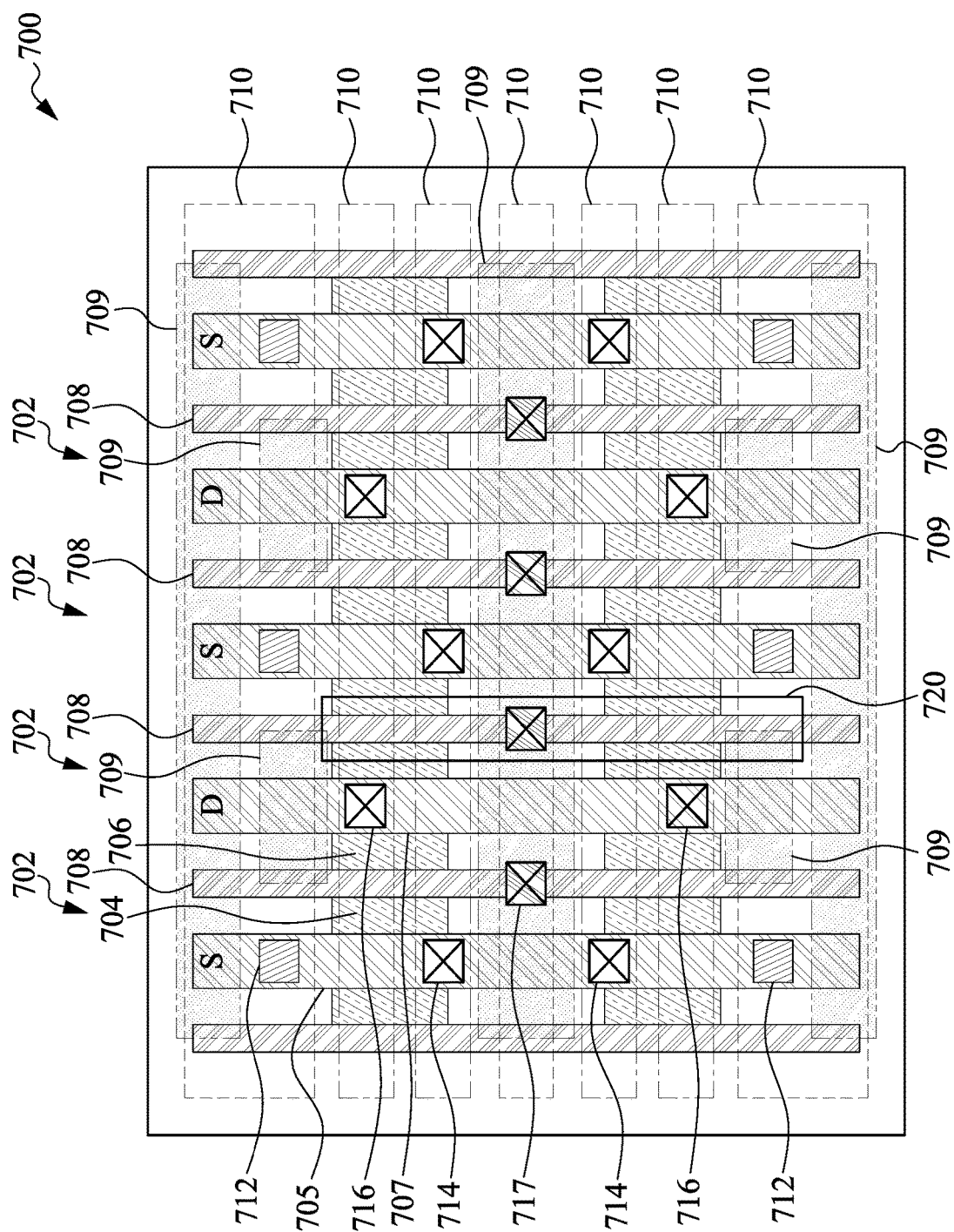
FIG. 14 is a top-view diagram schematically illustrating an example of M0 lines and below in an IC that includes analog cells designed and manufactured using the digital circuit design rules and the digital fin boundary, in accordance with some embodiments.

In another aspect of the analog cells designed using the digital fin boundary, the maximum EM current can be increased using shorter metal lines, such as shorter M0 lines and shorter M1 lines. FIG. 14 is a top-view diagram schematically illustrating an example of M0 lines and below in an IC 700 that includes analog cells designed using the digital circuit design rules and the digital fin boundary, in accordance with some embodiments. In IC 700, at least some of the metal lines can be made shorter, which increases the maximum allowed EM current through the metal.

The IC 700 includes multiple finfets 702 situated from left to right in FIG. 14. Each of the finfets 702 includes fin source regions 704 electrically coupled to one or more MD 705 at S, fin drain regions 706 electrically coupled to one or more MD 707 at D, and a gate 708 situated between the corresponding source and drain regions 704 and 706. The gate 708 includes poly. In some embodiments, each of the finfets 702 has MD 705 and MD 707 cut in CMD regions 709.

In some embodiments, in each of the finfets 702, the MD 705 of the source S is connected to M0 710 through one or more VD2 712 and through one or more VD 714. Also, in each of the finfets 702, the MD 707 of the drain D is connected to M0 710 through one or more VD 716. Each of the gates 708 is connected to M0 710 through a VG 717.

The IC 700 includes a cut M0 region 720, where M0 710 is cut to make shorter lines of M0 710. This cut M0 region 720 is allowed using the digital circuit design rules and the digital fin boundary, as opposed to the analog circuit design rules and the analog fin boundary. With shorter lines of M0 710, the maximum EM current is higher. Also, the cut M0 lines 710 can be situated directly next to VD and/or vias VIA0 (shown in FIG. 15). In some embodiments, the lengths of the cut M0 lines range from 0.5 CPP to 8 CPP, and in some embodiments, M0 pitch ranges from 5 nm to 40 nm.

Figure 15:
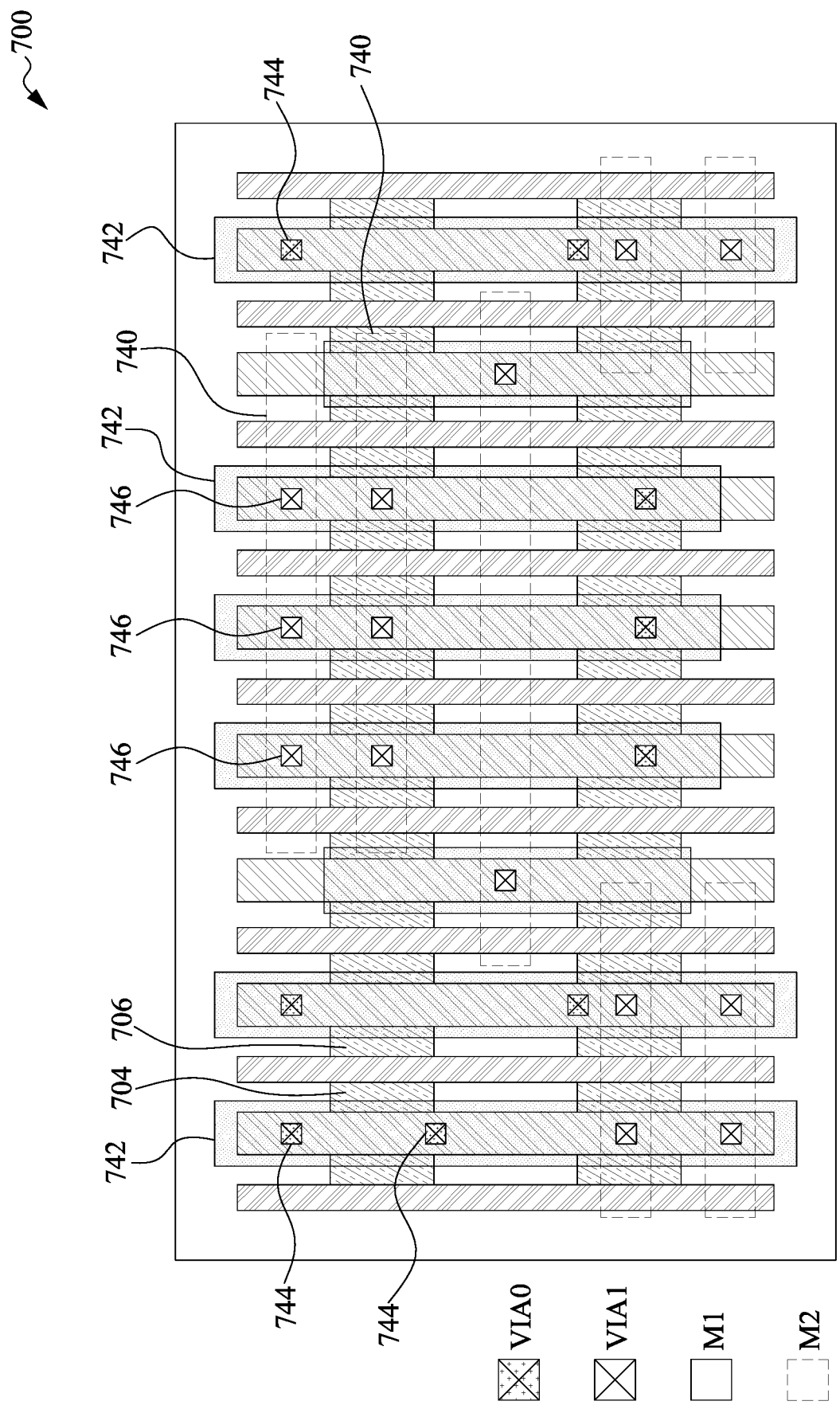
FIG. 15 is a top-view diagram schematically illustrating an example of back end of line (BEOL) layers up to M2 of the IC of FIG. 14, in accordance with some embodiments.

FIG. 15 is a top-view diagram schematically illustrating an example of BEOL layers up to M2 740 of the IC 700, in accordance with some embodiments. The IC 700 includes M2 740 disposed in horizontal lines or tracks and M1 742 disposed in vertical lines or tracks.

M0 710 is disposed in horizontal lines or tracks on the IC 700, such that the vertical lines of M1 742 are orthogonal to the horizontal lines of M0 710 and orthogonal to the horizontal lines of M2 740. The tracks of M1 742 are connected to various tracks of M0 710 through vias 744 (VIA0), and the tracks of M1 742 are connected to the tracks of M2 740 through vias 746 (VIA1). Thus, the BEOL layers up to M2 740 are electrically coupled to the source/drain regions 704 and 706 and, in some embodiments, to the gates 708. In some embodiments, M1 pitch ranges from 28 nm to 60 nm.

In some embodiments, each of the finfet cells 702 is like finfet cell 38, such that the finfet cells 702 are shorter than corresponding finfet cells, such as finfet cell 32, designed and manufactured using the analog circuit design rules and the analog fin boundary. In some embodiments, the finfet cells 702 can be less than 7 CPP. Thus, with shorter cell heights, the length of M1 742 is shorter in the finfet cells 702 and the EM maximum current is higher.

Figure 16:
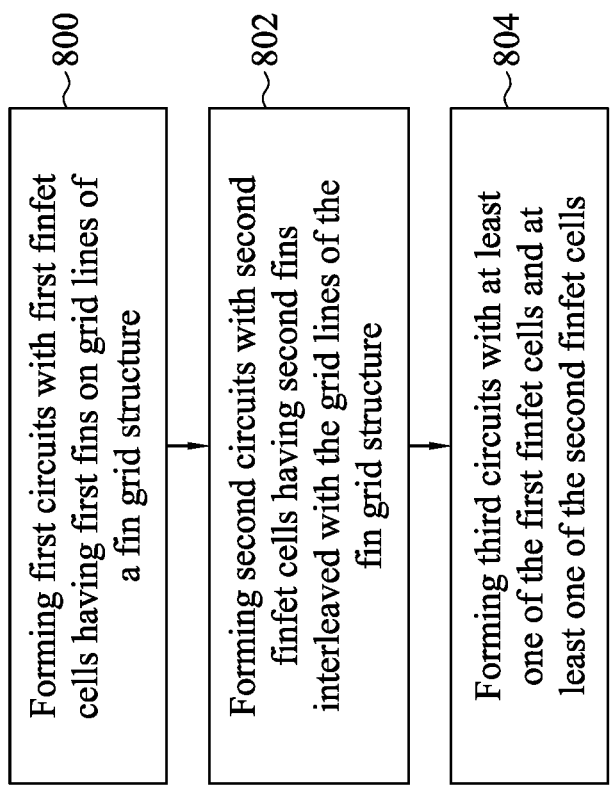
FIG. 16 is a flow chart diagram illustrating a method of manufacturing a semiconductor structure, in accordance with some embodiments.

FIG. 16 is a flow chart diagram illustrating a method of manufacturing a semiconductor structure, in accordance with some embodiments. At 800, the method includes forming first circuits with first finfet cells having first fins on grid lines of a fin grid structure. In some embodiments, the first circuits are circuit blocks 22a and 22b and the first finfet cells are cells 30, 32, 34, and 36. In some embodiments, the fin grid structure is fin grid structure 40 and the grid lines are grid lines 42. In some embodiments, the first finfet cells are designed and manufactured using the analog circuit design rules and the analog fin boundary. In some embodiments, the fin grid structure corresponds to and is associated with the analog fin boundary.

At 802, the method includes forming second circuits with second finfet cells having second fins interleaved with the grid lines of the fin grid structure. In some embodiments, the second circuits are circuit blocks 22c-22g and the second finfet cells are like finfet cell 38. In some embodiments, the fin grid structure is fin grid structure 40 and the grid lines are grid lines 42. In some embodiments, the second finfet cells are designed and manufactured using the digital circuit design rules and the digital fin boundary.

At 804, the method includes forming third circuits with at least one of the first finfet cells and at least one of the second finfet cells. In some embodiments, the third circuits are circuit blocks 22h and 22i, where the first finfet cells are finfet cells 30, 32, 34, and 36 and the second finfet cells are like finfet cell 38. In some embodiments, the first, second, and third circuits are part of a serdes circuit, such as serdes circuit 20.

In some embodiments, the method includes forming a long channel voltage-controlled oscillator and a common bias generator in the first circuits, forming a multiplexer and a slicer in the second circuits, and forming a serializer circuit and a deserializer circuit in the third circuits.

In some embodiments, the method includes situating or placing serdes circuits that include the second finfet cells directly adjacent logic circuits that include the second finfet cells to reduce the size of the semiconductor structure. In other embodiments, the first, second, and third circuits are part of another circuit, such as a circuit that includes both analog and digital circuits.

In some embodiments, the method further includes forming MEOL layers in the second finfet cells. In some embodiments, forming the MEOL layers includes forming a first source/drain contact having a first resistance, and forming a second source/drain contact having a second resistance that is less than or equal to 0.5 times the first resistance.

Disclosed embodiments thus provide semiconductor structures, such as ICs, that include circuits designed and manufactured using a combination of a first set of design rules with a first fin boundary and a second set of design rules with a second fin boundary. In some embodiments, the first set of design rules are analog circuit design rules with an analog fin boundary and the second set of design rules are digital circuit design rules (logic design rules), such as standard cell logic design rules, with a digital fin boundary. The performance of the circuits designed and manufactured using the digital fin boundary improves as process geometries are scaled down or reduced.

The disclosed embodiments further include finfet cells having fins that are not situated on grid lines of a fin grid structure associated with the analog circuit design rules and the analog fin boundary. Instead, the fins are situated between the grid lines of the fin grid. In some embodiments, the finfet cell height of these finfet cells is decreased, such that the device size is made smaller. Also, in each of these finfet cells there is a space between fins in the middle of the finfet cell, which can be used for routing metal, such that space usage in and around the finfet cell can be increased and the device size made smaller. In addition, the digital fin boundary of the fins in these finfet cells is the same as the digital fin boundary of fins in logic cells, such that the circuits that use these finfet cells can be placed directly adjacent logic cells designed with the digital fin boundary, without including a keep-out zone or region between the finfet cells and the logic cells. This also saves space and reduces the size of the device.

The disclosed embodiments include finfet cells designed and manufactured with the digital circuit design rules and the digital fin boundary, which can provide higher GM, higher UGF, and higher maximum EM currents. In some embodiments, the finfet cells can be used as switches in current mode logic.

In some embodiments, the finfet cells include MEOL layers that are not included in circuits designed and manufactured using the analog circuit design rules and the analog fin boundary. The MEOL layers include a larger source/drain contact VD2 that has a resistance at least 50% lower than the resistance of a smaller source/drain contact VD. In some embodiments, the finfet cells include cut PODE that is filled with a high-K dielectric, which reduces leakage and improves isolation. Together, these features increase Ion and the GM and decrease the IR voltage drop.

The disclosed embodiments further include finfet cells designed with the analog fin boundary that can be used in I/O devices and as long channel finfets. In these finfet cells, the long channel finfet cells have lower noise levels and higher fin density such that area can be scaled down.

In some embodiments, the advantages of designing and manufacturing semiconductor structures that include analog cells designed and manufactured using the digital circuit design rules and the digital fin boundary include finfet cells with higher GM, higher UGF, and higher EM. The GM is higher since resistance is lower in the MEOL and BEOL layers. Also, the UGF=GM/C is higher since the GM is higher and the MEOL capacitance C is lower. In addition, the maximum EM current is higher since the metal lines are shorter, where the digital circuit design rules allow M0 to be cut to provide shorter M0 lines and the cell height is shorter which results in shorter M1 lines.

In accordance with some disclosed embodiments, a semiconductor structure includes first finfet cells and second finfet cells. Each of the first finfet cells having an analog fin boundary according to analog circuit design rules, and each of the second finfet cells having a digital fin boundary according to digital circuit design rules. The semiconductor structure further includes first circuits formed with the first finfet cells, second circuits formed with the second finfet cells, and third circuits formed with one or more of the first finfet cells and one or more of the second finfet cells.

In accordance with further embodiments, a semiconductor structure includes first finfet cells and second finfet cells. The first finfet cells having a first fin boundary including first active areas aligned with corresponding grid lines that have a uniform pitch and first gate conductors electrically coupled to the first active areas. The second finfet cells having a second fin boundary including second active areas interleaved with the grid lines of the first fin boundary and second gate conductors coupled with the second active areas.

In accordance with still further embodiments, a method of manufacturing a semiconductor structure includes forming first circuits with first finfet cells having first fins on grid lines of a fin grid structure, forming second circuits with second finfet cells having second fins interleaved with the grid lines of the fin grid structure, and forming third circuits with at least one of the first finfet cells and at least one of the second finfet cells.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first finfet cells, each of the first finfet cells having an analog fin boundary according to analog circuit design rules;
   second finfet cells, each of the second finfet cells having a digital fin boundary according to digital circuit design rules;

first circuits formed with the first finfet cells;
second circuits formed with the second finfet cells; and
third circuits formed with one or more of the first finfet cells and one or more of the second finfet cells,
wherein the second finfet cells include layers that include a plurality of via-over-diffusion contacts including a first via-over-diffusion contact having a first size to provide a first resistance and a second via-over-diffusion contact having a second size that is greater than the first size to provide a second resistance that is less than or equal to 0.5 times the first resistance of the first via-over-drain contact.

2. The semiconductor structure of claim 1, wherein the second finfet cells are used as switches in current mode logic.

3. The semiconductor structure of claim 1, wherein the first size of the first Via-over diffusion contact ranges from 6 nm×6 nm to 20 nm×20 nm and the second size of the second via-over diffusion s from 8 nm×8 nm to 24 nm×24 nm.

4. The semiconductor structure of claim 1, wherein the first finfet cells are used in input/output (I/O) circuits and as long channel transistors.

5. The semiconductor structure of claim 1, wherein serializer/deserializer circuit cells formed with the second finfet cells directly abut digital logic circuit cells formed with the second finfet cells.

6. The semiconductor structure of claim 1, wherein the second finfet cells are configured to include metal layers having shorter metal lengths, such that electromigration (EM) maximum currents are higher.

7. The semiconductor structure of claim 1, wherein the second finfet cells have higher transconductance (GM), higher unit gain frequency (UGF), and higher maximum electromigration (EM) currents.

8. The semiconductor structure of claim 1, wherein:
the first finfet cells have first fins located on grid lines of a fin grid structure; and
the second finfet cells have second fins located between the grid lines of the fin grid structure.

9. The semiconductor structure of claim 1, wherein the first circuits, the second circuits, and the third circuits are part of a serializer/deserializer circuit.

10. The semiconductor structure of claim 1, wherein the first circuits include a long channel voltage-controlled oscillator and a common bias generator, the second circuits include a high speed multiplexer and a high speed slicer, and the third circuits include a serializer circuit and a deserializer circuit.

11. A semiconductor structure, comprising:
first finfet cells having a first fin boundary including:
first active areas aligned with corresponding grid lines that have a uniform pitch; and
first gate conductors disposed on and electrically coupled to the first active areas; and
second finfet cells having a second fin boundary including:
second active areas interleaved with the grid lines of the first fin boundary; and
second gate conductors disposed on and electrically coupled with the second active areas,
wherein at least one of second finfet cells includes layers that include a plurality of via-over-diffusion contacts including a first via-over-diffusion contact having a first size to provide a first resistance and a second via-over-diffusion contact having a second size that is greater that the first size to provide a second resistance that is less than or equal to 0.5 times the first resistance of the first via-over-drain contact.

12. The semiconductor structure of claim 11, wherein at least one of the second finfet cells is used as a switch in a current mode logic device.

13. The semiconductor structure of claim 11, wherein the first size of the first via-over diffusion contact ranges from 6 nm×6 nm to 20 nm×20 nm and the second size of the second via-over diffusion contact ranges from 8 nm×8 nm to 24 nm×24 nm.

14. The semiconductor structure of claim 11, wherein at least one of the first finfet cells is used in at least one of an input/output (I/O) circuit and a long channel transistor.

15. The semiconductor structure of claim 11, comprising a serializer/deserializer cell and a digital logic cell, wherein the serializer/deserializer cell includes a first finfet cell of the second finfet cells and the digital logic cell includes a second finfet cell of the second finfet cells, and the first finfet cell of the serializer/deserializer cell is located directly adjacent the second finfet cell of the digital logic cell.

16. A semiconductor structure, comprising:
first circuits with first finfet cells having first fins in a first fin spacing of a fin grid structure;
second circuits with second finfet cells having second fins in a second fin spacing that is interleaved with the first fin spacing of the fin grid structure; and
third circuits with at least one of the first finfet cells and at least one of the second finfet cells,
wherein the second finfet cells include layers that include a plurality of via-over-diffusion contacts including a first via-over-diffusion contact having a first size to provide a first resistance and a second via-over-diffusion contact having a second size that is greater than the first size to provide a second resistance that is less than or equal to 0.5 times the first resistance of the first via-over-drain contact.

17. The semiconductor structure of claim 16, comprising:
a serializer/deserializer circuit that includes the first circuits, the second circuits, and the third circuits.

18. The semiconductor structure of claim 17, wherein:
the first circuits include a long channel voltage-controlled oscillator and a common bias generator;
the second circuits include a multiplexer and a slicer; and
the third circuits include a serializer circuit and a deserializer circuit.

19. The semiconductor structure of claim 16, comprising:
serializer/deserializer circuits that include the second finfet cells directly adjacent logic circuits that include the second finfet cells.

20. The semiconductor structure of claim 16, wherein the first size of the first via-over diffusion contact ranges from 6 nm×6 nm to 20 nm×20 nm and the second size of the second via-over diffusion contact ranges from 8 nm×8 nm to 24 nm×24 nm.

* * * * *